(12) United States Patent
Ranganathan et al.

(10) Patent No.: US 12,174,248 B2
(45) Date of Patent: Dec. 24, 2024

(54) ERGONOMIC LOADING FOR A TEST INTERFACE BOARD (TIB) / BURN-IN-BOARD (BIB) IN A SLOT-BASED TEST SYSTEM

(71) Applicant: Advantest Test Solutions, Inc., San Jose, CA (US)

(72) Inventors: Karthik Ranganathan, Foothill Ranch, CA (US); Gregory Cruzan, Anaheim, CA (US); Gilberto Oseguera, Corona, CA (US); Toshiyuki Kiyokawa, Kukishi Saitama (JP); Takayuki Shigihara, Tokyo (JP)

(73) Assignee: Advantest Test Solutions, Inc., San Jose, CA (US)

( * ) Notice: Subject to any disclaimer, the term of this patent is extended or adjusted under 35 U.S.C. 154(b) by 168 days.

(21) Appl. No.: 17/830,940

(22) Filed: Jun. 2, 2022

(65) Prior Publication Data
US 2023/0393190 A1 Dec. 7, 2023

(51) Int. Cl.
*G01R 31/28* (2006.01)
*G01R 1/02* (2006.01)
*G01R 1/04* (2006.01)
*G01R 1/067* (2006.01)
*G01R 1/073* (2006.01)
*G01R 31/20* (2006.01)
*G01R 31/27* (2006.01)

(52) U.S. Cl.
CPC ..... *G01R 31/2887* (2013.01); *G01R 31/2834* (2013.01)

(58) Field of Classification Search
CPC . G01R 1/02; G01R 1/04; G01R 1/045; G01R 1/067; G01R 1/073; G01R 31/20; G01R 31/27; G01R 31/28; G01R 31/2822; G01R 31/2887; G01R 31/2834
See application file for complete search history.

(56) References Cited

U.S. PATENT DOCUMENTS

| | | | |
|---|---|---|---|
| 5,722,514 A | 3/1998 | Kiyokawa | |
| 7,339,387 B2 * | 3/2008 | Dangelo | G01R 31/2863 324/750.05 |
| 9,354,272 B2 | 5/2016 | Teoh et al. | |
| 2011/0050268 A1 * | 3/2011 | Co | G11C 29/56 324/757.01 |
| 2014/0015559 A1 * | 1/2014 | Lee | G11C 29/56016 324/756.02 |

FOREIGN PATENT DOCUMENTS

CN 111940323 A 11/2020

* cited by examiner

Primary Examiner — Neel D Shah

(57) ABSTRACT

A testing apparatus includes a tester rack with a plurality of slots where at least one slot in the tester rack is a dedicated slot operable to receive a test interface board (TIB) from a back of the tester rack, where the back of the tester rack is opposite a front of a tester rack, and where the front of the tester rack faces a handler and a front-facing elevator. The apparatus also includes a handler operable to load devices under test (DUTs) onto the TIB and a front-facing elevator move the TIB from the dedicated slot to an available slot in the tester rack, wherein the available slot includes power electronics operable to connect to the TIB to test devices under test (DUT) disposed on the TIB.

20 Claims, 17 Drawing Sheets

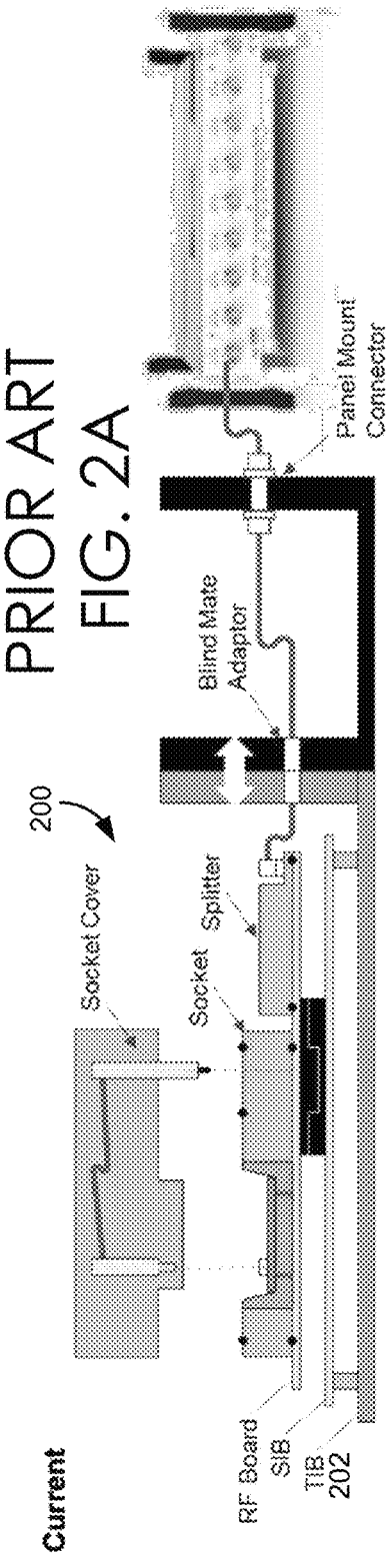
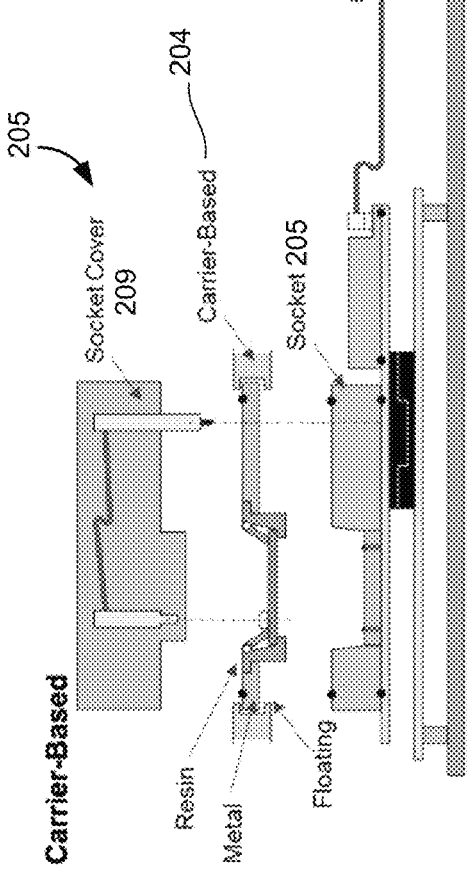
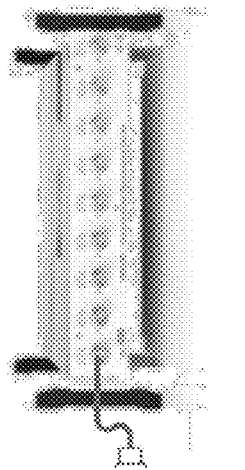

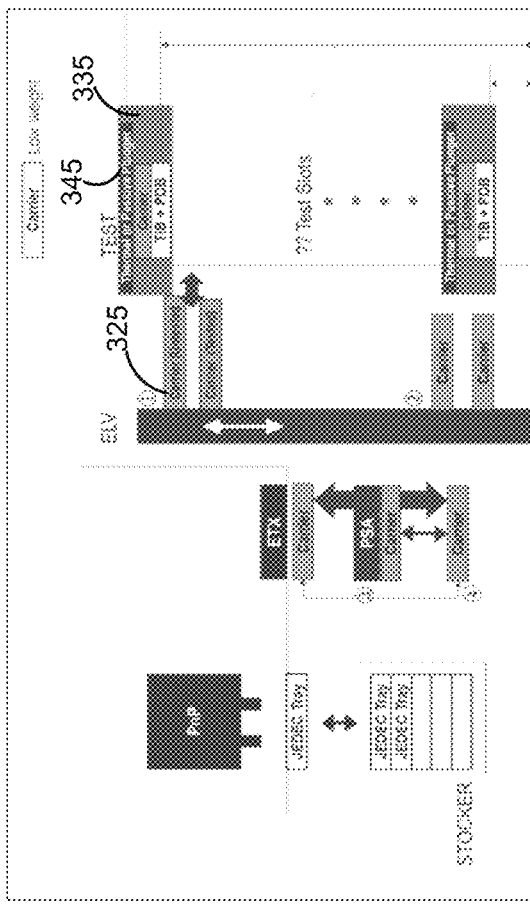
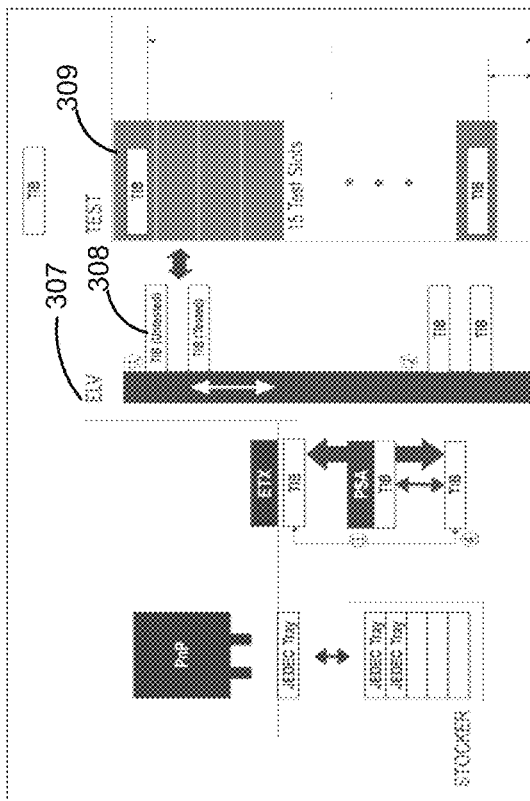
FIG. 3A
PRIOR ART
FIG. 3B

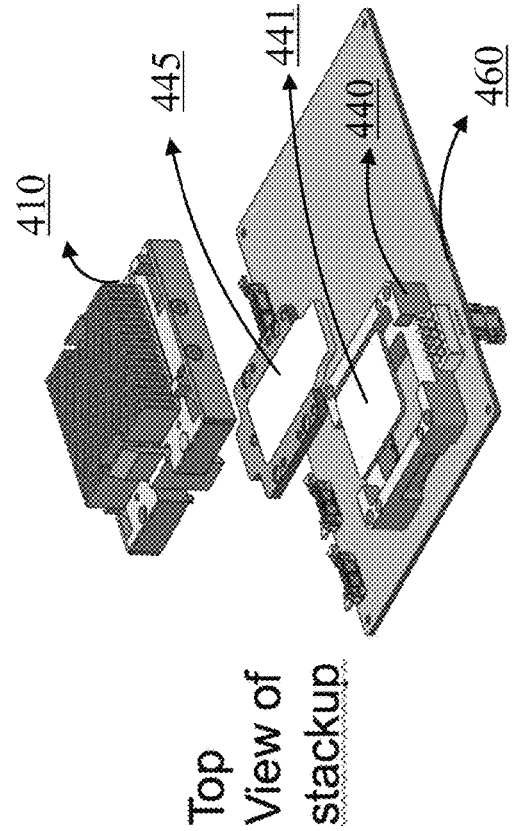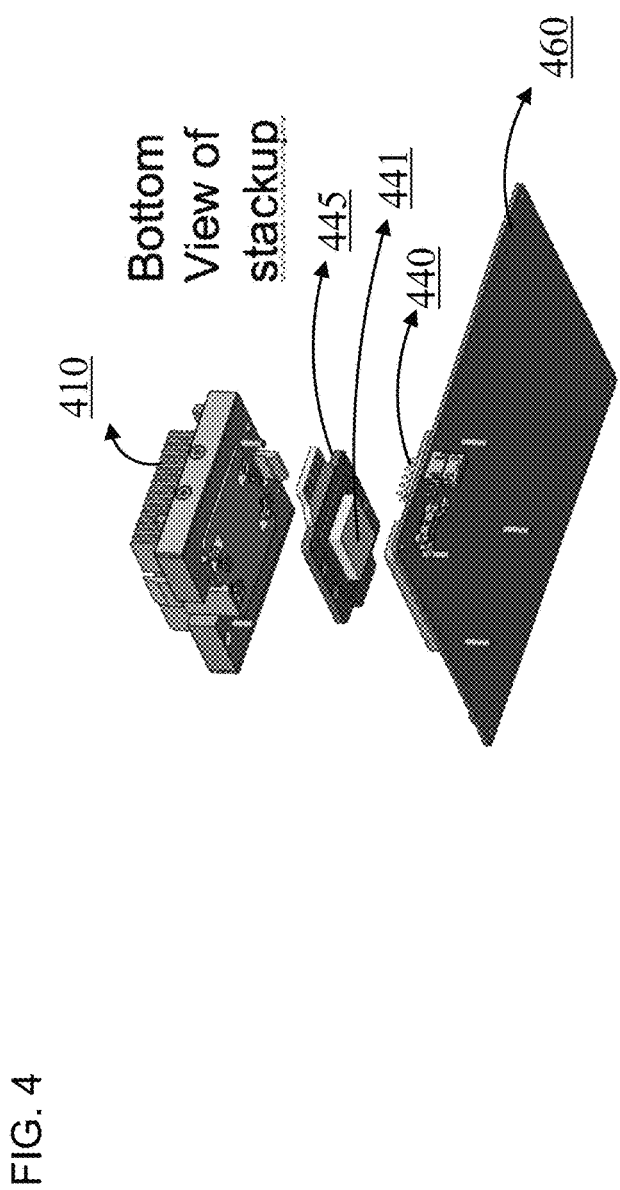
FIG. 4

Slot Tester Loaded with TIBs

ERGONOMIC LOADING FOR A TEST INTERFACE BOARD (TIB) / BURN-IN-BOARD (BIB) IN A SLOT-BASED TEST SYSTEM

FIELD OF THE INVENTION

The present disclosure relates generally to the field of automated test equipment for testing integrated circuit (IC) devices and more specifically to techniques for massively parallel high-volume testing of devices under test.

BACKGROUND OF THE INVENTION

Automated test equipment (ATE) includes any testing assembly that performs a test on a semiconductor wafer or die, an integrated circuit (IC), a circuit board, or a packaged device such as a solid-state drive. ATE assemblies may be used to execute automated tests that quickly perform measurements and generate test results that can then be analyzed. An ATE assembly may be anything from a computer system coupled to a meter, to a complicated automated test assembly that may include a custom, dedicated computer control system and many different test instruments that are capable of automatically testing electronics parts and/or semiconductor wafer testing, such as system-on-chip (SOC) testing or integrated circuit testing. ATE systems both reduce the amount of time spent on testing devices to ensure that the device functions as designed and serve as a diagnostic tool to determine the presence of faulty components within a given device before it reaches the consumer. ATE systems can also be used to test and record device performance for pass/fail and for device binning determinations.

When a typical ATE system tests an integrated circuit device (commonly referred to as a device under test or DUT), the ATE system applies stimuli (e.g. electrical signals) to the device and checks responses (e.g., currents and voltages) of the device. Typically, the end result of a test is either "pass" if the device successfully provides certain expected responses within pre-established tolerances, or "fail" if the device does not provide the expected responses within the pre-established tolerances. More sophisticated ATE systems are capable of evaluating a failed device to potentially determine one or more causes of the failure. Other ATE systems can categorize a performance of a device for binning purposes.

There are several different types of ATE systems currently existing in the marketplace. One of them involves transporting devices under test (DUTs) on Tester Interface Boards (TIBs) that include sockets and active test circuitry. The advantage of transporting DUTs using TIBs is that a separate apparatus for device transport is not required. The TIB is used for both testing and transport. Further, the alignment of the DUTs can be performed at a central alignment station. This is particularly useful where vision alignment for finer pitches is required. Also, blind-mate connectors for TIBs allow quick replacement for servicing. ATE systems using TIBs have several drawbacks. For example, the high-frequency signal path between the socket (per DUT) test circuitry and the equipment in a test rack is repeatedly disconnected during normal operation, making maintenance of signal fidelity and high-speed signal path calibration difficult. Further, there is an increased cost (both an initial set-up cost and maintenance costs) for high cycle count high-frequency connectors between a TIB and a test rack.

Another type of ATE system involves inserting DUTs directly into sockets on stationary test boards with pick-and-place assemblies. This type of ATE system has its advantages also. For example, this type of ATE system does not require additional mechanics and electronics other than the pick-and-place assembly. Further, there is no need to repeatedly disconnect the signal path between the test board and instrumentation during normal operation. Finally, shielding and other top-side contact solutions are easy to implement due to available space. Nevertheless, this type of ATE systems also has its drawbacks. For example, parallelism and Units Per Hour (UPH) (units tested per hour) is severely limited so this type of ATE system is unsuitable for high-volume manufacturing (HV) applications. Further, there is a low utilization of the expensive pick-and-place apparatus, which often remain idle when the test time is long.

A different type of ATE system transports DUTs to test slots (or stations) on JEDEC trays or intermediate passive carriers and loads them into test slots with per-slot pick-and-place assemblies. Again, there are drawbacks associated with this type of system. For example, the per-slot pick and place assemblies increase system cost. Further, there is a low utilization of per-slot pick-and-place assemblies, which often sit idle when test time is long. These types of ATE systems may also potentially be unreliable due to multiple pick-and-place assemblies.

Finally, the classic memory tester and handler type of conventional ATE system also has many associated drawbacks. For example, memory testers and handlers specifically work only with memory and do not incorporate shields for RF or any type of top-side contact. Further, space requirements for System Level Test (SLT) test circuitry and lack of any vertically-stacked slot architecture limit parallelism.

Another disadvantage of conventional tester systems (e.g., ATEs that transport DUTs on TIBs that include sockets and active test circuitry) is that as DUTs have gotten larger, the TIB sizes have also gotten larger. The TIBs can be as large as 26×26 inches and may weigh several pounds. Previous generation TIBs were smaller and lighter and could easily be manually loaded into the slots in a tester. Manual placement of TIBs into slots or even into the side of an elevator is increasingly difficult and does not meet ergonomic standards. As size and weight constraints associated with TIBs increase, requiring multiple people to lift the TIBs manually poses constraints in a production or volume testing environment.

BRIEF SUMMARY OF THE INVENTION

Accordingly, there is a need for an ATE system that addresses the drawbacks associated with conventional ATE tester systems. Embodiments of the present invention provide a massively parallel high-volume test capability in a slot-based architecture, using multi-device passive carriers to transport the semiconductor devices from the loading/unloading station to the test slots. Use of carriers eliminates the requirement to move the test sockets and/or test circuitry with the devices, which is the method used in the current state-of-the-art high-volume slot-based test systems. Eliminating this requirement advantageously simplifies the design of the system and provides improved performance (especially for RF and other high frequency applications), improved reliability, and reduced cost.

Further, embodiments of the present invention can be used to load carriers and TIBs in highly parallel automated slot-based test architectures especially for burn-in and system level test (SLT) architectures. Embodiments of the present invention allow for the loading of a single TIB or a trolley full of TIBs from the back of a tester rack using a dedicated TIB loading slot (e.g., typically at the bottom of the rack or at any other point in the rack). This option advantageously allows for low changeover time of TIBs and also allows heavier TIBs to be used in the system. As SLTs and burn-in solutions penetrate deeper into the testing industry, TIBs will continue to vary in size and weight making the ergonomic loading options provided by embodiments of the present invention more important.

In one embodiment, a testing apparatus includes a tester rack with a plurality of slots where at least one slot in the tester rack is a dedicated slot operable to receive a test interface board (TIB) from a back of the tester rack, where the back of the tester rack is opposite a front of a tester rack, and where the front of the tester rack faces a handler and a front-facing elevator. The apparatus also includes a handler operable to load devices under test (DUTs) onto the TIB and a front-facing elevator move the TIB from the dedicated slot to an available slot in the tester rack, wherein the available slot includes power electronics operable to connect to the TIB to test devices under test (DUT) disposed on the TIB.

In one embodiment, a testing system comprises a tester rack comprising a plurality of slots wherein at least one slot in the tester rack is a dedicated slot operable to receive a carrier from a back of the tester rack, wherein the back of the tester rack is opposite a front of a tester rack, wherein the front of the tester rack faces a handler and a front-facing elevator, wherein the carrier comprises an array of DUTs, wherein each DUT in the array of DUTs aligns with a respective socket of a plurality of sockets disposed on a test interface board (TIB) operable to be affixed in an available slot of the plurality of slots, and wherein the available slot is different from the dedicated slot. The system further comprises a handler operable to load devices under test (DUTs) onto the carrier. Also, the front-facing elevator operable to move the carrier from the dedicated slot to the available slot in the tester rack.

In one embodiment, a method of testing DUTs on a Burn-in-Board (BIB) comprises disposing a dedicated slot in a tester rack operable to receive the BIB from a back of the tester rack, wherein the BIB comprises a plurality of DUTs disposed on the BIG, and wherein the back of the tester rack is opposite from a side of the tester rack facing a handler and a front-facing elevator. The method also comprises disposing the front-facing elevator adjacent to the front of the tester rack, wherein the front-facing elevator is operable to move the BIB in the tester rack from the dedicated slot to an available slot in the tester rack, wherein the available slot comprises power electronics to connect to the BIB. Further, the method comprises loading the TIB into the dedicated slot in the tester rack, moving the TIB, using the front-facing elevator, from the dedicated slot to the available slot and testing the plurality of DUTs while the BIB is positioned in the available slot.

Using the beneficial aspects of the systems described, without their respective limitations, embodiments of the present invention provide a novel solution to address the drawbacks mentioned above.

The following detailed description together with the accompanying drawings will provide a better understanding of the nature and advantages of the present invention.

BRIEF DESCRIPTION OF THE DRAWINGS

Embodiments of the present invention are illustrated by way of example, and not by way of limitation, in the figures of the accompanying drawings and in which like reference numerals refer to similar elements.

FIG. 2A is an illustration of a TIB placed in a slot of a conventional tester.

FIG. 2B is an illustration of a TIB that remains fixed in a slot of a tester rack while a carrier tray slides into the slot to move DUTs into the tester rack in accordance with embodiments of the present invention.

FIG. 3A illustrates a side-view of a conventional tester.

FIG. 3B illustrates a side-view of a tester that allows the TIB to remain fixed in the slot while the carriers are moved in and out of the slot in accordance with embodiments of the present invention.

FIG. 4 illustrates a top view and a bottom view of a stack-up of various components of an integrated test cell using an active thermal interposer in accordance with an embodiment of the invention.

DETAILED DESCRIPTION OF THE INVENTION

In accordance with one embodiment of the present invention, a slot-based tester system comprises: a tester (including power delivery board and controls); a tester board such as ATE load-board or Test Interface Board (TIB) with Socket Interface Board (SIB) or Burn-In Board (BIB); an open socket to hold one or more DUTs (Device Under Test); a passive carrier/test tray that holds multiple DUTs (multiple carriers or test trays may be present in the system); an optional parallel cover assembly system (PCA) to place socket covers (with optional shields) on top of DUTs in the carrier; a handler and movement system similar to a memory test handler that places DUTs into carriers and further places the DUTs within the carriers on top of the sockets; plungers to push down the socket covers (with optional shields) and DUTs into the sockets and one or more racks with dedicated TIB loading slots used for loading TIBs or burn-in boards (BIBs) from the back of the rack.

Generally, the typical users of the tester system disclosed herein would be: integrated device manufacturers, fabless semiconductor manufacturers, and outsourced semiconductor assembly and test companies engaged in the high-volume manufacturing and test of devices that operate in frequency ranges requiring careful maintenance of signal fidelity between test equipment and DUTs and electrical shielding to reduce interference between individual DUTs during testing. Embodiments of the present invention are integral to handling and interfacing solutions included as part of an ATE (Automated Test Equipment) or SLT (System-level Test) system.

Figure 1:
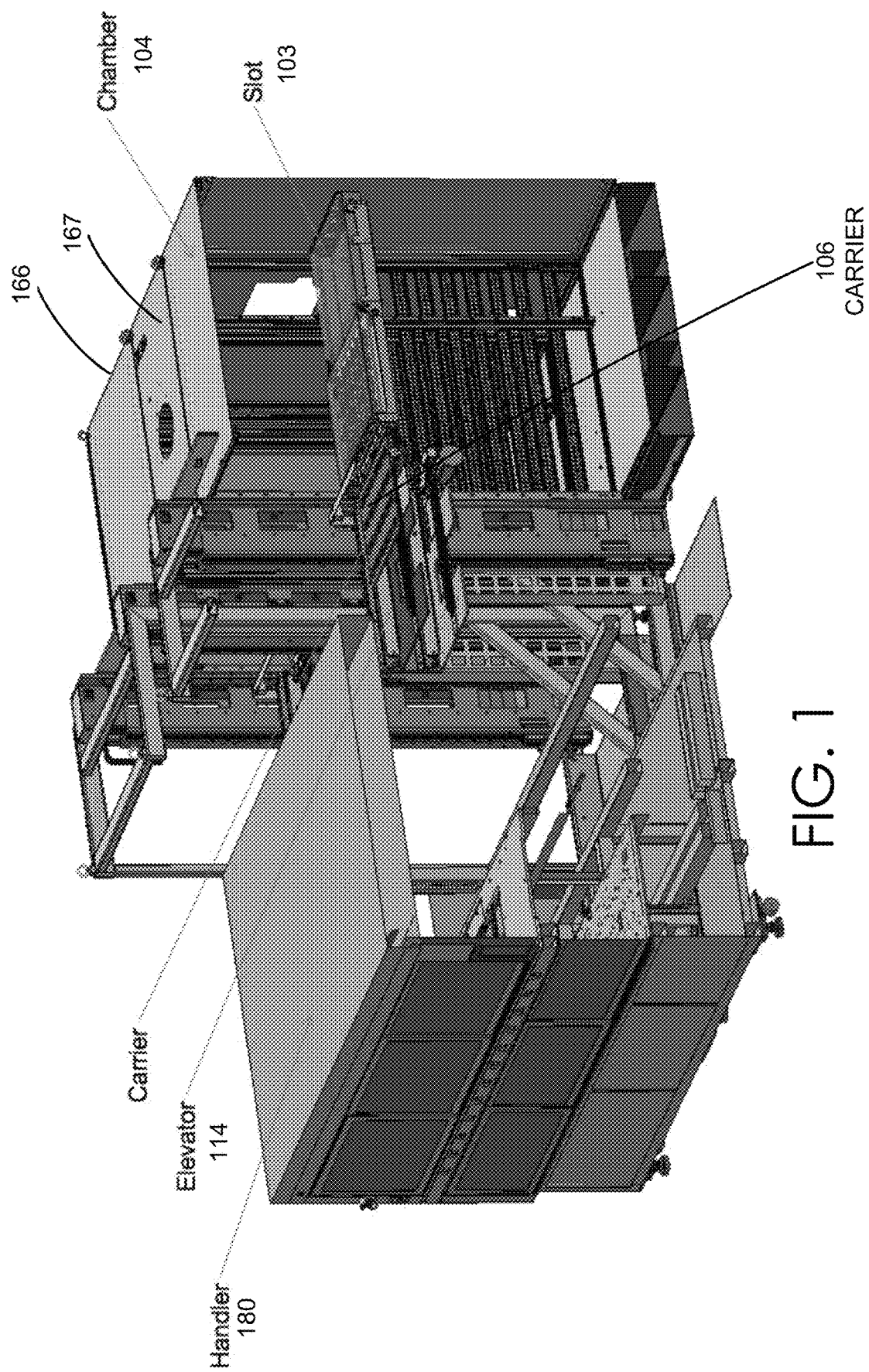
FIG. 1 illustrates a cross-sectional view of a tester system that combines a carrier-based DUT delivery mechanism with a slot-based test architecture in accordance with embodiments of the present invention.

Embodiments of the present invention eliminate many of the drawbacks of conventional tester systems. Embodiments of the present invention combine a carrier-based DUT delivery mechanism with a slot-based high volume semiconductor test system architecture. FIG. 1 illustrates a cross-sectional view of a tester system that combines a carrier-based DUT delivery mechanism with a slot-based test architecture in accordance with embodiments of the present invention. The tester system comprises a chamber 104 with multiple racks (e.g., a left 166 and a right rack 167) with a plurality of slots (e.g., slot 103) that can be stacked vertically. Stacking the slots vertically allows more DUTs to be tested in parallel. For example, the chamber 104 can comprise upwards of 30 slots. In one embodiment, the slots may also be stacked horizontally.

As mentioned previously, the tester system may combine the carrier-based device delivery mechanism with the slot-based architecture. The tester system comprises a handler 180. The tester system also comprises a pick-and-place mechanism that loads the carriers and also further comprises an elevator system 114 that moves the carrier 106 vertically to a particular desired spot. The rationale behind using the carrier is that all the test electronic circuitry can remain in place in the test rack. This has advantages for high speed applications where the tester needs to maintain a stable and high accuracy signal path.

Conventional tester systems by comparison connect and disconnect test electronics with the sockets any time new DUTs are inserted into the test racks. This would not be ideal for high speed signal paths which require robust connectivity, repeatability and accuracy of signals. Embodiments of the present invention advantageously leave the test circuitry in place. This has advantages for high speed signal paths and provides reliable connectivity, repeatability and accuracy of signals.

The high-parallelism architecture provided by embodiments of the present invention is advantageous because the test sockets and test circuitry remain in place in a fixed location with continuous connections to test instrumentation and supporting resources during normal operation. An example application is RF or other high-frequency test. In order to maintain signal fidelity over repeated insertions of the DUTs, the TIBs (Tester Interface Boards) with the sockets and corresponding per-DUT test circuitry remain fixed in the test rack of the system, and are only removed and disconnected for servicing. Since high-frequency testing requires specialized and costly instrumentation, it is not technically or financially feasible to build this equipment into the TIB, so the high-frequency signals must pass through connectors between the TIB and the test equipment in the test rack.

In conventional high-parallelism SLT systems, the TIBs move back-and-forth between the pick-and-place assembly for loading/unloading of the DUTs and the test rack for testing, requiring repeated disconnecting/reconnecting of the signal paths between the test rack and the DUTs. In other words, the TIB would need to be regularly disconnected and pulled out of the slots in order to load new batches of DUTs.

In the tester assembly of the embodiments of the present invention, the TIB does not need to be removed in and out of the slot. It remains in place and does not need to be disconnected to load a fresh batch of DUTs. With the TIBs remaining fixed in the test rack in accordance with embodiments of the present invention, the tester of the present invention uses a passive carrier or test tray to move the DUTs between the pick-and-place assembly and the test rack. This maintains high-parallelism and high UPH (units per hour) of without requiring repeated disconnects of the signal paths. During testing, the entire carrier with multiple DUTs is inserted into a slot in the test rack, and lowered onto the fixed TIB. The DUTs remain in the carrier while per-DUT socket covers in the test rack are applied to provide the necessary force between the DUT and socket to complete the electrical connections. Fixing the TIBs in the rack also provides additional flexibility to add external equipment and wire that into the test rack without then worrying about disconnecting that equipment.

FIG. 2A is an illustration of a TIB placed in a slot 200 of a conventional tester. As shown in FIG. 2A, the TIB 202 in conventional testers is configured to slide in and out of the slot each time a new batch of DUTs needs to be loaded. The process is that the TIB slides out of the slot, new DUTs are loaded and the TIB then slides back into the slot with the new DUTs for further testing.

FIG. 2B is an illustration of a TIB that remains fixed in a slot 205 of a tester rack while a carrier tray 204 slides into the slot to move DUTs into the tester rack in accordance with embodiments of the present invention. The carrier tray slides in on top of the socket 205 and the actuator array (comprising a socket cover 209) on top comes down and pushes the DUT (or DUTs) down into the socket to make contact. The carrier stays in place as the actuator array pushes the DUT down into the socket. The DUTs on the carrier are situated in respective pockets of the carrier on a thin membrane. The DUTs rest on the membrane and get pushed into the socket. The bottom of the DUTs comprises a ball-grid array where the solder balls of the ball-grid array get pushed through the membrane to make contact with the socket. After the DUTs are done testing, the actuator rises back up and the carrier slides back out of the slot with the DUTs on it. In the tester therefore, all the TIBs are able to stay in the slot while the carriers are moved in and out of the various slots.

FIG. 3A illustrates a side-view of a conventional tester 302. As shown in FIG. 3A, in the conventional testers, the elevator 307 moves the TIBs vertically and slides the TIBs 308 (along with the socket and test circuitry) into the test slots into the tester rack 309. Conventional testers move the TIBs between the pick and place assembly and the elevator and, finally, the test rack (with the slots).

FIG. 3B illustrates a side-view of a tester 303 that allows the TIB to remain fixed in the slot while the carriers are moved in and out of the slot in accordance with embodiments of the present invention. In one embodiment, a carrier 325 comprising the DUTs is slid into a slot in the tester rack 335. The TIB and the power distribution board (PDB) stay in place within the rack 335. The plunger 345 pushes the DUTs on the carrier into the sockets. The carrier 325 is typically the moving piece that moves in and out of the rack 335 while the remaining components, e.g., the TIB, PDB and plunger stay within the rack. In one embodiment, multiple carriers are employed in a tester system to transport DUTs in an out of the vertical slots of the tester rack.

In one embodiment, thermal interposers may be added to the design. The thermal interposer may be added to a plunger mechanism (e.g., plunger 345) within the slot. Alternatively, in a different embodiment, the active thermal interposer may be added on top of the DUT via a parallel cover assembly (PCA) design. The parallel cover assembly places and actuates covers over the DUTs after the carriers have been pushed into the test slot.

In one embodiment of the present invention, no carriers are used, and the TIBs themselves are transferred in and out of the tester racks. This alternate embodiment of the present invention may also comprise an integrated test cell comprising: a tester (including a power delivery board and controls); a tester board such as an ATE load board or Test Interface Board (TIB) with a Socket Interface Board (SIB); an open socket to hold a DUT; an active thermal interposer where the interposer is a distinct piece by itself (unlike conventional test systems, the interposer is not part of the socket or the thermal system); a superstructure/lid that contains the active thermal interposer (ATI) or passive interposer and is actuated by a parallel socket actuation (PSA) system; a thermal system that heats or cools the device including a thermal control system (for convection or conducted cooling and heating) that has a universal interface across products; a handler that places DUTs into the socket; and one or more racks with dedicated TIB loading slots used for loading TIBs or burn-in boards (BIBs) from the back or rear position of the rack. In an embodiment, the active thermal interposer has the core functionality of a temperature control system configured into a discrete component. For example, the active thermal interposer has thermal capabilities and may be able to heat or cool devices. In an embodiment, each DUT on the TIB advantageously interfaces with a discrete thermal interposer where each thermal interposer is specific to a respective DUT and makes intimate thermal contact with the respective DUT.

FIG. 4 illustrates a top view and a bottom view of a stack-up of various components of an integrated test cell using an active thermal interposer (ATI) in accordance with an embodiment of the invention. The integrated test cell comprises a socket interface board (SIB) 460. The SIB comprises a device application specific design.

Further, the integrated cell comprises a socket 440 having a DUT specific design, e.g., with pogos and a side structure. The socket 440 may be configured to power the active thermal interposer from the bottom of the SIB.

The integrated cell also comprises the ATI 441. The active thermal interposer is specific to the DUT placed in the socket. The ATI 441 can be powered from the bottom of the SIB or from the top. The ATI can, in one embodiment, accommodate multiple dies and heights (associated with the DUT). In one embodiment, the interposer may be passive. As noted above, the ATI is a distinct and discrete component. This facilitates advantageously changing the ATI depending on the application. It can be a heat-only ATI to control the temperature more accurately or a thermoelectric based cool-only ATI to cool the DUT below the evaporation temperature, wherein different DUTs on the same TIB may be in contact with different types of ATIs. Furthermore, the heating or cooling abilities reside in the interposer, therefore, a user has the option to determine how much power to supply to each interposer, which determines how hot a respective interposer becomes.

Combining the thermal characteristics into the interposer also advantageously precludes any need for extra interfaces between the DUT and the thermal system, which was a drawback of conventional tester systems.

In an embodiment, the integrated cell comprises a superstructure/lid 445 that contains the passive or active thermal interposer 441. The superstructure 445 accommodates the thermal interposer 441 and, alternatively, may also accommodate a POP memory nest or passive interposer with different actuation forces. The superstructure 445 may also comprise a power interface to the active thermal interposer 441.

In an embodiment, the integrated cell may optionally comprise a heatsink 410. The heatsink 410 may be designed for high power dissipation and may also comprise a fan. In an embodiment, a parallel socket actuation system is used that places and actuates superstructures (socket lids) providing contact force to the DUT. As noted above, the superstructures may contain the ATI or passive interposers. The socket actuation system provides sufficient force to bring the thermal interposer in contact with the DUT. Conventional tester systems, by comparison, either use a closed socket system where the socket would apply pressure to the DUT. Alternatively, conventional tester systems use contact force applied from the thermal array or force array to hold the DUT in the socket. Embodiments of the present invention, however, comprise a parallel socket actuation system that actuates superstructures to hold the DUTs on a TIB in place.

The PSA, in accordance with embodiments of the present invention, aligns the superstructure individually but actuates in parallel. The system can also be easily modified to incorporate active thermal interposers as part of the superstructure. Alternatively, the system can be modified to incorporate a passive interposer or POP memory or other alternate structures.

In one embodiment, a handler places DUTs from JEDEC trays into the socket on the TIBs. The handler may also comprise elevators that load the TIBs (or BIBs) into slots where they connect to a power distribution board or tester. The embodiment discussed in connection with FIG. 4 may be associated with a tester system comprising two racks. For example, each rack may comprise 15 slots and a total of 30 TIBs (or BIBs) may need to be loaded into the system.

Figure 5:
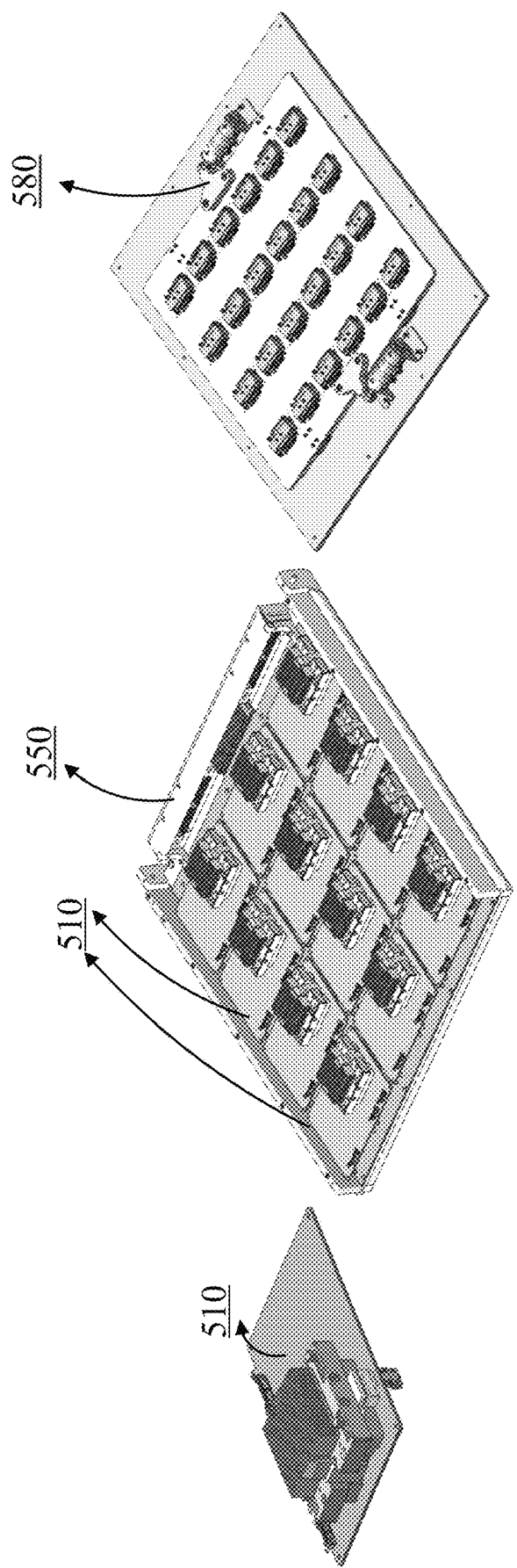
FIG. 5 illustrates the manner in which all the sockets on a TIB are actuated in accordance with an embodiment of the invention.

FIG. 5 illustrates the manner in which all the sockets on a TIB are actuated in accordance with an embodiment of the invention. As noted above, a TIB 550 comprises several SIBs 510. The PSA 580 actuates all the sockets in parallel while ensuring that the alignment for each socket is handled individually. In other words, the PSA aligns each socket individually but advantageously actuates in parallel. The PSA can place ATIs (which are built into the superstructure or lid) on the DUT and actuate several ATIs in parallel. The PSA, in one embodiment, can also place passive interposers with limited thermal capability. The PSA in other embodiments may also work with memory nests or alternate POP structures or some combination of ATIs with POP structures.

Embodiments of the present invention advantageously use an ATI in coordination with a PSA, which use solves several architectural and flexibility problems that occurred in conventional architectures. The ATI, in one embodiment, can be powered from the TIB/SIB or can be powered from a thermal head in a slot of a tester (within which the TIB is placed). Furthermore, the ATI, in one embodiment, can be customized with precision heaters, zone cooling, multi-die contact, gimbaling or optional cooling.

It should be noted that the TIB 550 of FIG. 5 can also be loaded with other TIBs into a slot-based architecture as shown in FIG. 1. In other words, the embodiments of FIGS. 4 and 5 do not comprise carriers like the embodiments discussed in connection with FIGS. 1, 2 and 3. In the embodiments of FIGS. 1, 2 and 3, the TIBs, once loaded into the racks of the tester system remain fixed in place while the DUTs are moved in and out of the tester racks using carriers. By comparison, in the embodiments of FIGS. 4 and 5, the TIBs (e.g., TIB 550) need to be transferred in and out of the tester racks more frequently.

As noted above, a disadvantage of conventional tester systems (e.g., ATEs that transport DUTs on TIBs that include sockets and active test circuitry) is that as DUTs have gotten larger, the TIB (or carrier) sizes have also gotten larger. The TIBs can be as large as 26×26 inches and may weigh several pounds. Previous generation TIBs were smaller and lighter and could easily be manually loaded into the slots in a tester. Additionally, the socket lids or superstructures have also correspondingly gotten larger making the TIBs even heavier. Manual placement of TIBs into slots or even into the side of an elevator is increasingly difficult and does not meet ergonomic standards. As size and weight constraints associated with TIBs increase, requiring multiple people to lift the TIBs manually poses constraints in a production environment.

Embodiments of the present invention provide more ergonomic loading options for TIBs (and/or carriers) into tester racks. In one embodiment, a single TIB (or carrier) can be ergonomically loaded from the back or rear position of a rack (e.g., a side of a rack opposite to the elevator and handler) using a dedicated TIB loading slot at the bottom of the rack. In one embodiment, the dedicating TIB loading slot may be at any point in the rack and is not limited to being at the bottom. In one embodiment, the dedicated slot will not comprise a PDB so that the TIB can be pushed straight into the slot without any obstruction. Further, in one embodiment, a trolley full of TIBs may be loaded into the rack using the dedicating TIB loading slot. This option advantageously allows for a low changeover time for TIBs (or carriers) and also allows heavier TIBs (or carriers) to be used in the system.

Figure 6:
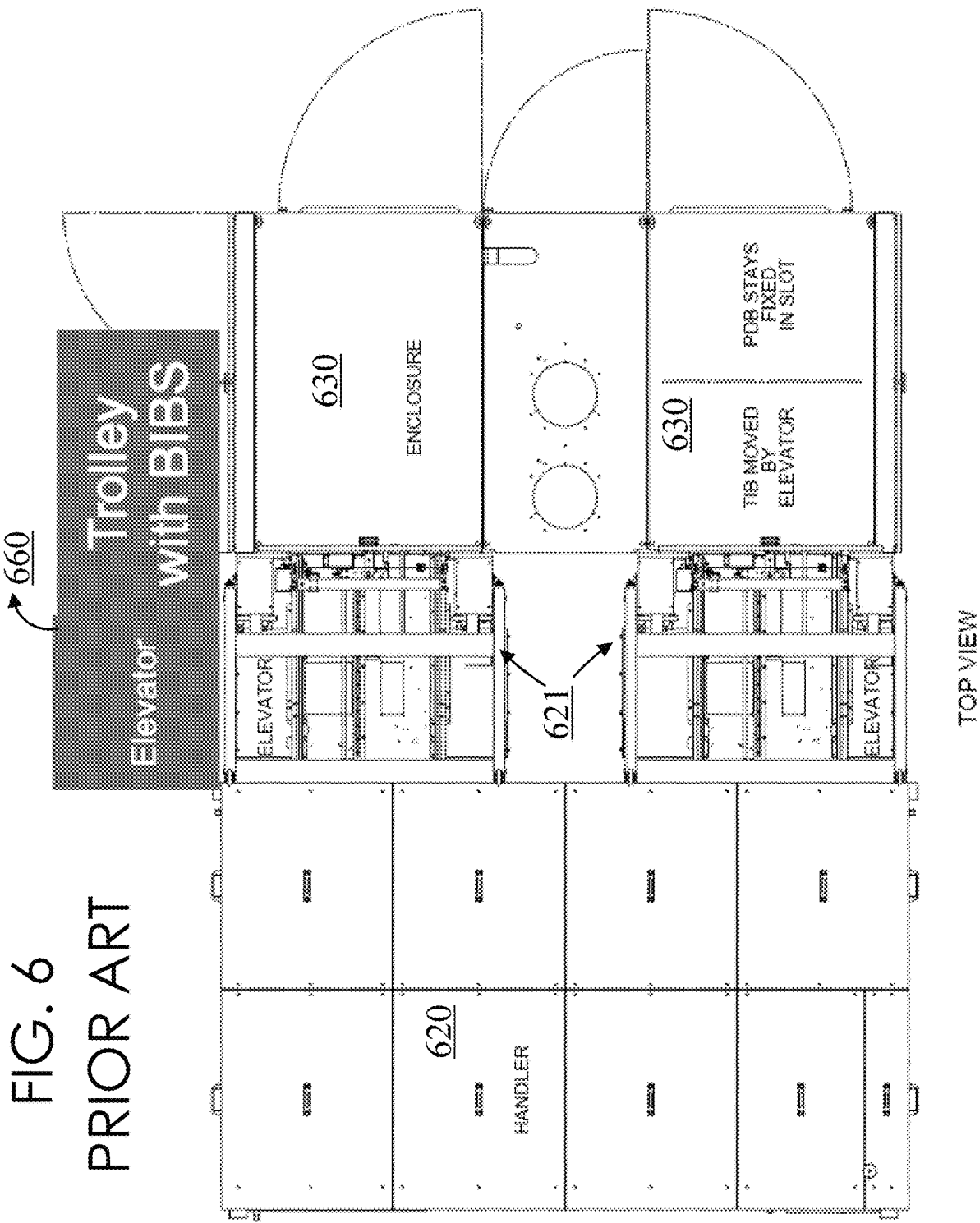
FIG. 6 illustrates a conventional method of loading TIBs (or carriers) into a tester system.

FIG. 6 illustrates a conventional method of loading TIBs (or carriers) into a tester system. The tester system in FIG. 6, among other things, comprises a handler 620 and elevators 621, wherein each elevator corresponds to a respective enclosure 630. Each enclosure comprises TIBs in racks, where the TIBs are moved by elevators. Alternatively, for the embodiments referred to in FIGS. 1 to 3, carriers may need to be moved around using the elevators within a rack. A PDB typically stays fixed in the slot while either the TIBs or carriers are moved in and out of the racks. Conventional tester systems typically comprise an extra chamber 660 adjacent to the tester equipment where a trolley full of BIBs or TIBs may be docked. Further, the elevators 621 need to be configured so they can move to the trolley chamber 660 in order to access the TIBs/BIBs to be loaded. The disadvantages of the approach shown in FIG. 6 are that it requires a permanent extra chamber on the side of the system with an extra 1 m×1 m keep-out area in an already large production system. Further, this design also requires an extra elevator or several extra axes of motion in the existing elevators to load TIBs/carriers/BIBs into the trolley.

Figure 7:
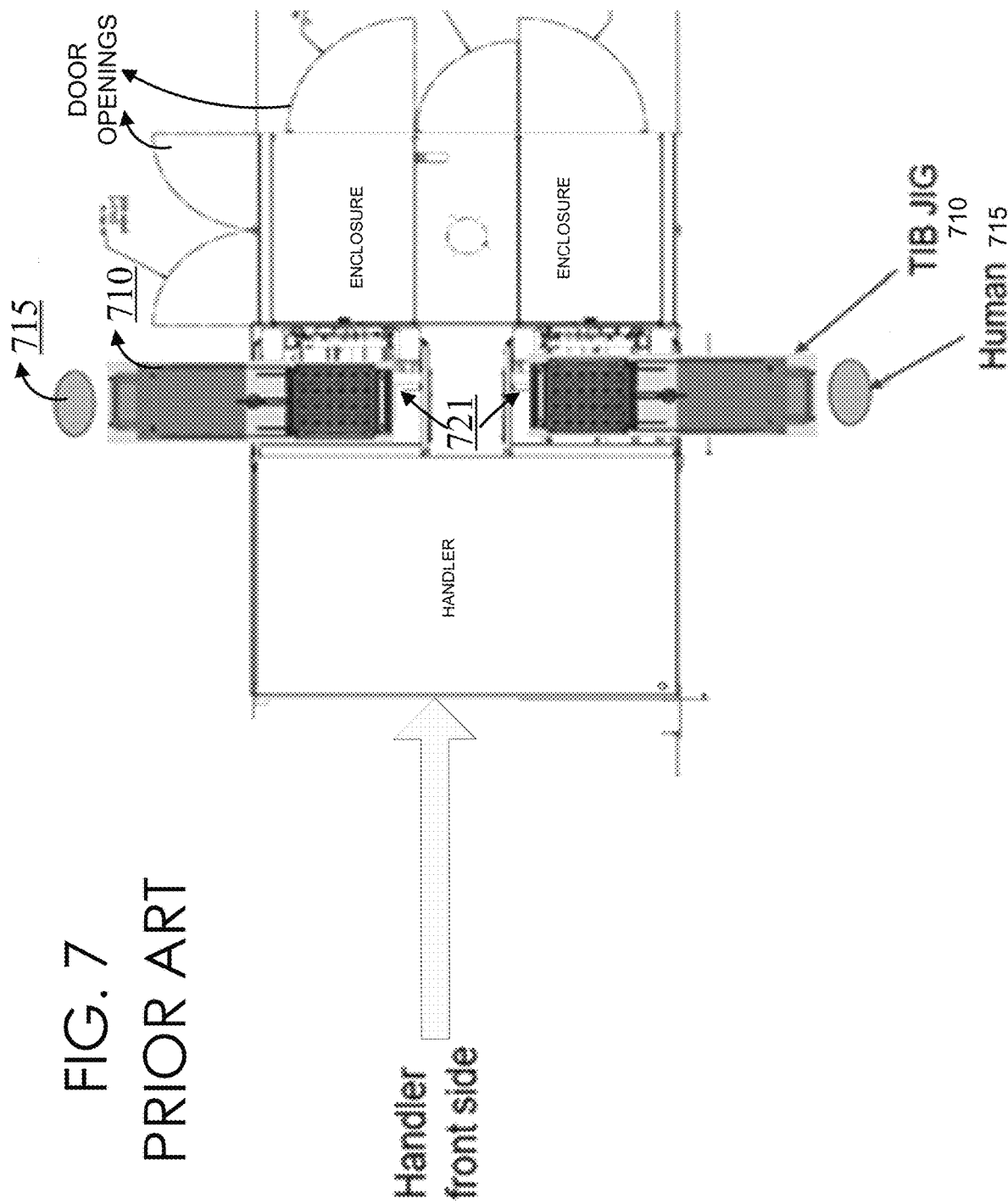
FIG. 7 illustrates another conventional method of loading TIBs (or carriers) into a tester system.

FIG. 7 illustrates another conventional method of loading TIBs (or carriers) into a tester system. In this method of loading TIBs, a jig or cart 710 is placed adjacent to the elevators 721. The TIBs are loaded manually on top of the elevator one by one through a side door that provides access to the elevator. Manually loading TIBs individually is problematic because TIBs are heavy and multiple people may be required to lift each TIB. Also, TIBs are loaded one at a time typically and changing multiple TIBs in a system requires a significant amount of changeover time. Furthermore, the elevators in such a tester may need to be designed so that they can move in the x and y direction as well as the z-direction (up and down) so that the TIBs can be loaded from the trolley onto the elevators and be carried back to be loaded into the enclosures. Elevators with additional axes of movement are costly to design and impose an additional space constraint on the system because the elevators need additional space to be able to move in multiple directions.

Another conventional method of loading TIBs involves simply manually loading the TIBs into the slots one by one. This option limits TIB sizes and weights to sizes that can be ergonomically and practically lifted by a single person.

Figure 8A:
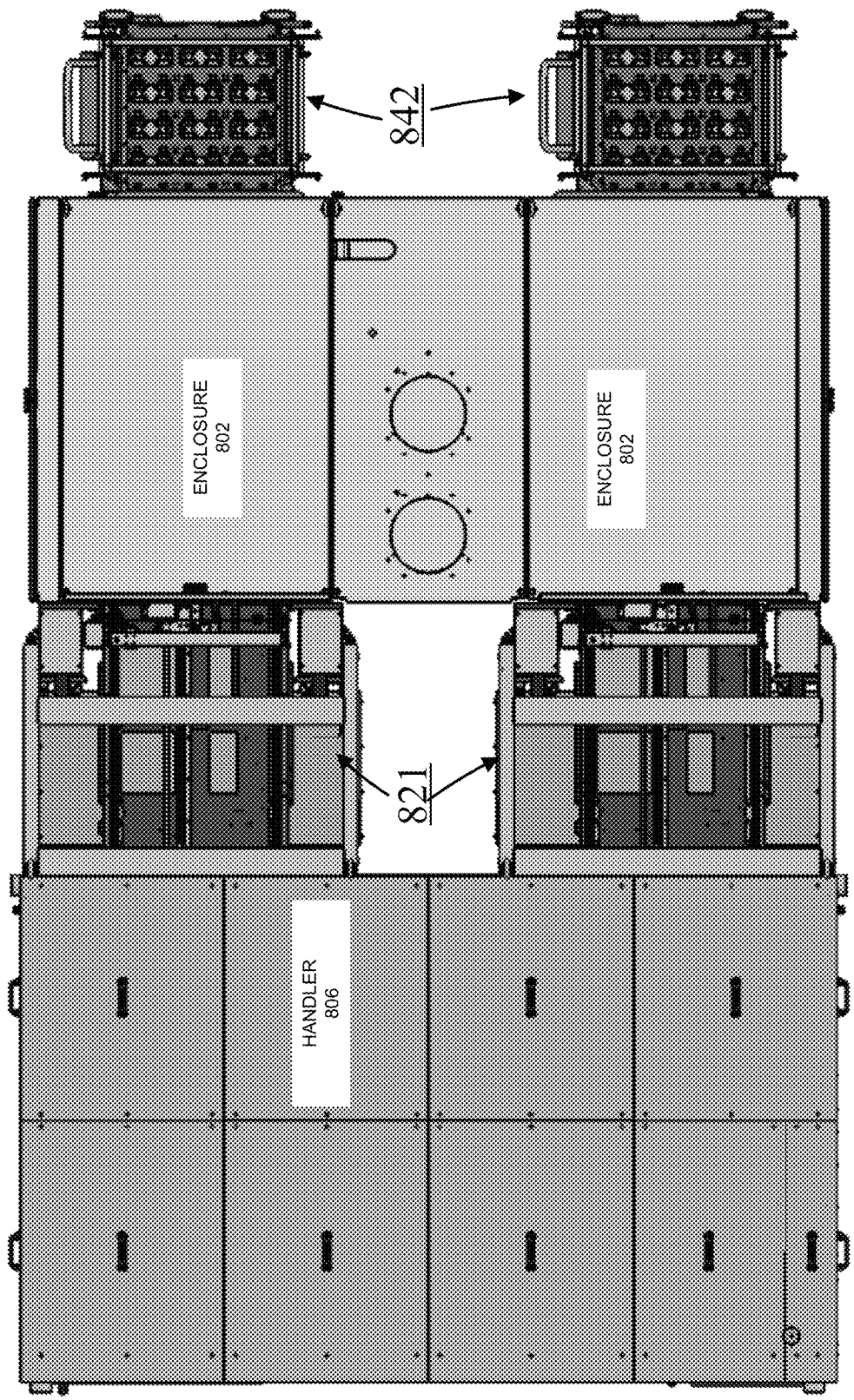
FIG. 8A illustrates a tester system wherein TIBs are loaded from a side of the tester racks opposite to that of the elevator and handler in accordance with an embodiment of the present invention.

FIG. 8A illustrates a tester system wherein TIBs are loaded from a side of the tester racks opposite to that of the elevator and handler in accordance with an embodiment of the present invention. In one embodiment of the present invention, TIBs/BIBs/carriers are loaded onto the tester racks from the back or rear position of the tester system. A handler 806 and front-side elevators 821 are located on a front side or forward position of the enclosures 802, which comprise the tester racks. The handler 806 places the DUTs in the ecosystem, e.g., by placing DUTs within the carriers for the embodiment discussed in FIGS. 1 to 3 or by placing DUTs directly in the sockets on the TIBs for the embodiment discussed in FIGS. 4 to 5.

Conventional tester system either load the TIBs from the same side as the elevators or handler or through a side door or opening that is located adjacent to the elevators (e.g., as shown in FIGS. 6 and 7). Embodiments of the present invention load the TIBs from the back-side, which is opposite to the side where the handler and elevators are positioned. The TIB jigs or carts 842 are positioned towards the backside of the tester system. The TIBs/BIBs/carriers are loaded by pushing a TIB one at a time into a fixed dedicated TIB loading slot at the bottom of the rack. As noted above, the dedicated slot will typically not comprise a PDB so that the TIB can be easily pushed into the slot. Each TIB that is loaded into the rack (or racks) is then lifted up by one of the front-side elevators 821 to its appropriate location. Thereafter, another TIB may be loaded into the system using the dedicated TIB loading slot and moved to its appropriate location using the front-side elevators 821. In one embodiment, a trolley full of TIBs may be moved into the racks employing this methodology.

Note that while conventional tester systems comprised elevators, the TIBs would have to be physically placed on the elevators before the elevators could move the TIBs into a dedicated slot in a tester rack. Physically lifting and placing TIBs on an elevator imposes a physical constraint on the size of the TIBs. Embodiments of the present invention advantageously avoid needing to lift TIBs (or carriers or BIBs) on top of the elevator by providing a dedicated slot into which a TIB can be pushed into, where the elevator can simply lift the TIB up from the dedicated slot to an open slot in the tester rack. Similarly, when the DUTs on a TIB (or carrier or BIB) are done being tested, the elevator can lift the TIB and move it back to the dedicated slot at the bottom where it can be pulled out and placed on a jig cart or trolley.

Figure 8B:
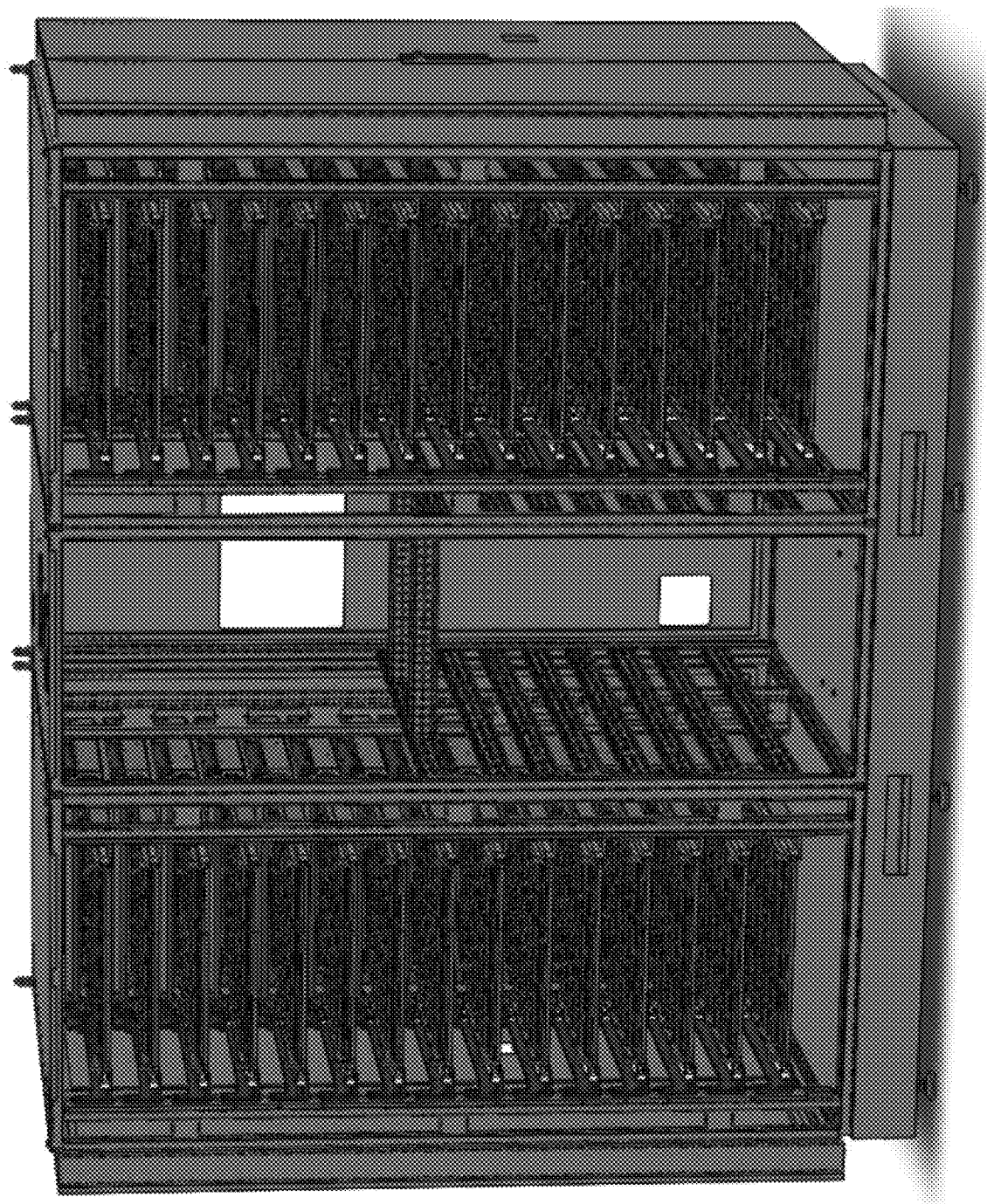
FIG. 8B illustrates a front-facing view of a tester enclosure comprising a left rack and a right rack loaded with TIBs.

FIG. 8B illustrates a front-facing view of a tester enclosure comprising a left rack and a right rack loaded with TIBs. The enclosure of FIG. 8B corresponds to enclosure 802 discussed in conjunction with FIG. 8A.

Figure 9:
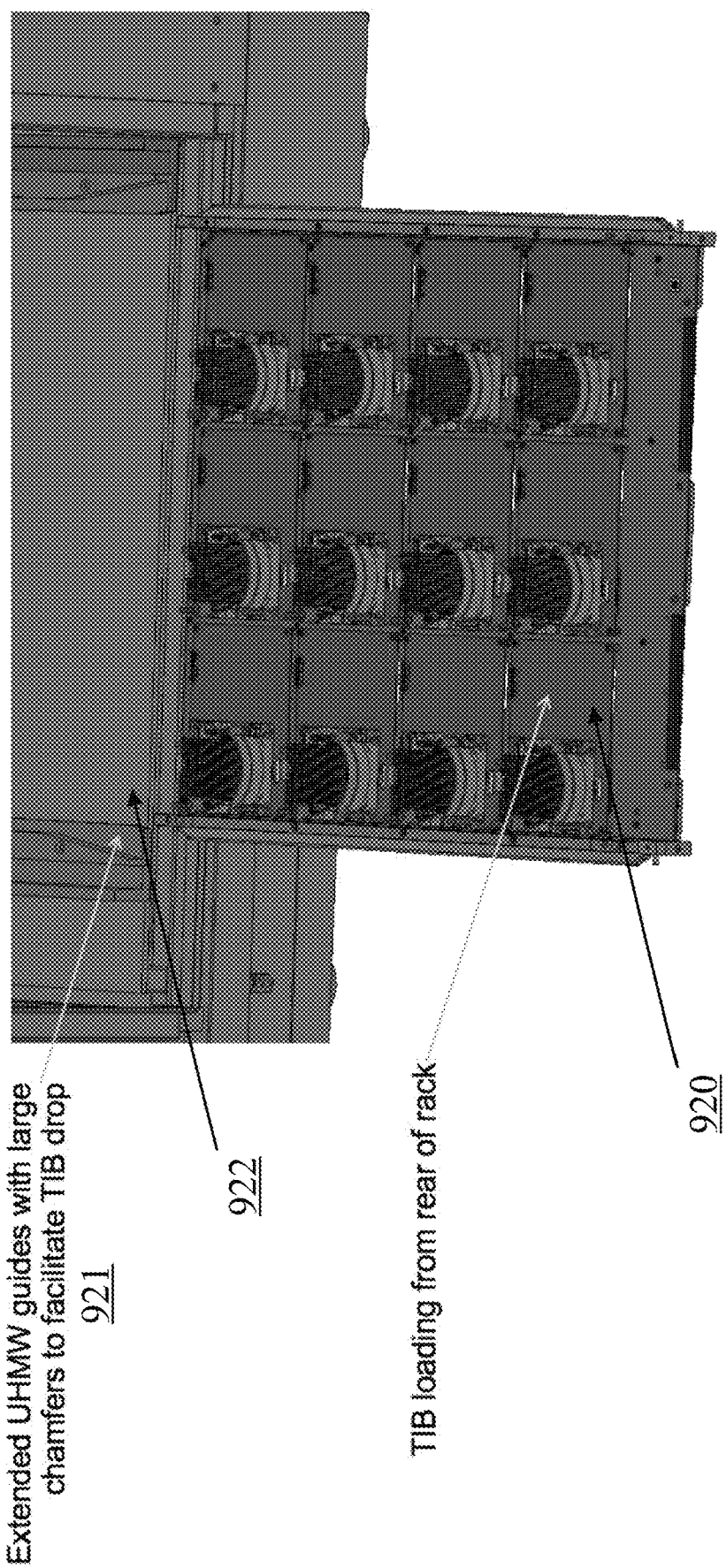
FIG. 9 illustrates the manner in which TIBs are loaded into a dedicated slot at the back of the rack of the tester system in accordance with an embodiment of the present invention.

FIG. 9 illustrates the manner in which TIBs are loaded into a dedicated slot at the back of the rack of the tester system in accordance with an embodiment of the present invention. As shown in FIG. 9, a TIB 920 (or BIB or carrier) may be loaded from the back of a tester rack into a dedicated slot 922. The tester rack comprises ultra-high molecular weight polyethylene (UHMW) guides 921 with large chamfers to facilitate the TIB dropping into the dedicated slot.

Note that for the embodiment discussed in connection with FIGS. 1 to 3, the dedicated slot at the bottom of the rack in the back may be used for either TIBs or carriers. As discussed above, in that embodiment once the TIBs are loaded into the rack, they remain affixed to the PDBs in the slots while the carriers with DUTs are moved in and out of the racks. Accordingly, the dedicated slot 922 (FIG. 9) for the embodiment of FIGS. 1 to 3 may be used to either load the TIBs into the rack or it may also be used to load carriers with (or without) DUTs and position them into the open slots in the rack.

In one embodiment, once the TIB (or BIB or carrier) is moved into the dedicated slot, the front-side elevator (e.g., elevators 821 in FIG. 8) moves the TIB to the appropriate slot within the tester rack. In some embodiments, the elevator is programmed with a sensor operable to determine which of the slots in a tester rack are available. The elevator transports a freshly loaded TIB into an open slot based on the reading from the sensor. In one embodiment, the dedicated slot may also comprise a sensor that communicates a signal to the front-side elevator when a TIB is loaded into the dedicated slot. The front-side elevator will then find an available slot to which the TIB will be transferred. In one embodiment, the tester system may be connected to a computer (comprising a processor and memory) that comprises a database, where the database keeps track of slots in each connected tester track that are empty. Accordingly, the computer communicates with the elevator to load TIBs in only those slots which are empty. Similarly, the database also keeps track of which slots are full and transmits signals to the elevator to extract TIBs from the slots that are full after the DUTs are done being tested.

Figure 10:
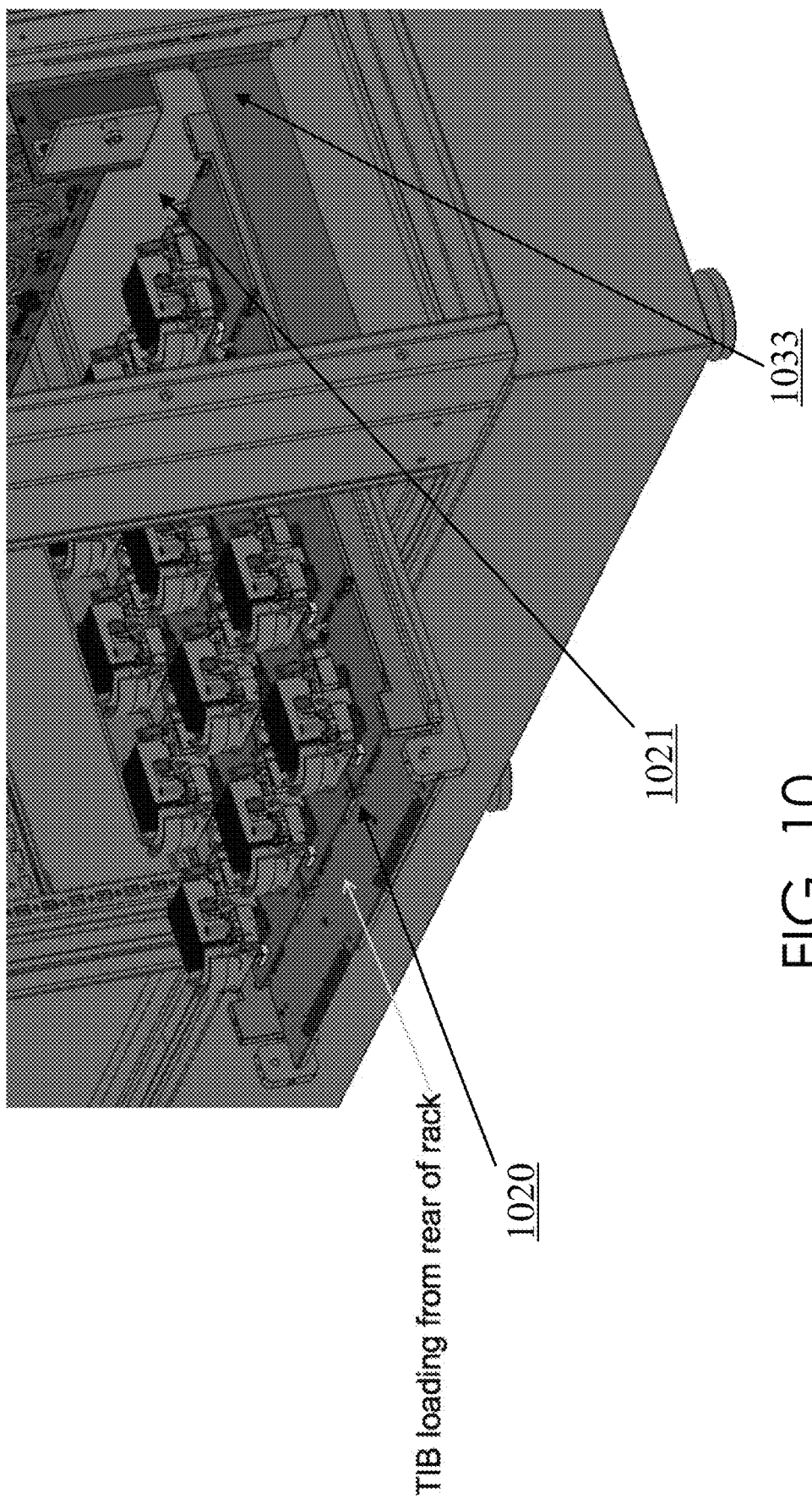
FIG. 10 illustrates a different view of a TIB being loaded into a dedicated slot at the back of the rack of the tester system in accordance with an embodiment of the present invention.

FIG. 10 illustrates a different view of a TIB being loaded into a dedicated slot at the back of the rack of the tester system in accordance with an embodiment of the present invention. As shown in FIG. 10, the TIB 1020 is loaded from the rear of the rack and is slid into the dedicated slot 1021 at the bottom of the rack. In one embodiment, the dedicated slot 1021 will comprise side-rails and/or guard-rails, e.g., 1033 to allow the TIB 1020 to slide into the slot easily. Further, there may be a mechanism (not shown in Figure) to prevent the TIB from sliding too far deep into the slot and to stop it at an appropriate location from where the elevator can grab it and move it to the desired slot. Once the TIB has been slid into the appropriate location into the dedicated slot, an elevator can pull it and move it upwards in the z-direction to an available slot location.

Figure 11:
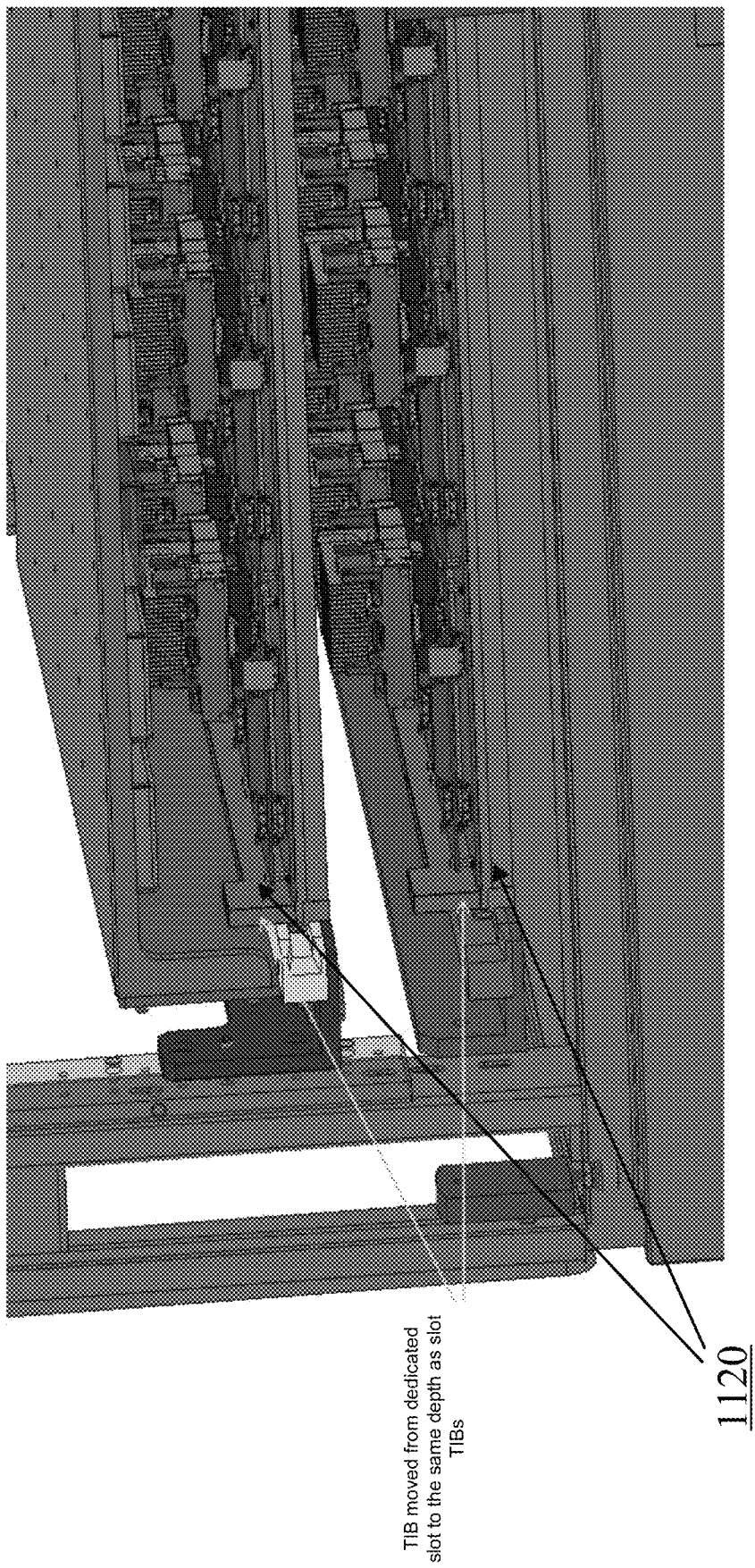
FIG. 11 illustrates a TIB being moved upwards from the dedicated slot at the bottom of the rack in accordance with an embodiment of the present invention.

FIG. 11 illustrates a TIB being moved upward from the dedicated slot at the bottom of the rack in accordance with an embodiment of the present invention. As shown in FIG. 11, once a TIB 1120 has been loaded into the dedicated slot, it can be moved upwards (either manually or using an elevator) to the same depth as an available slot within the rack.

Figure 12:
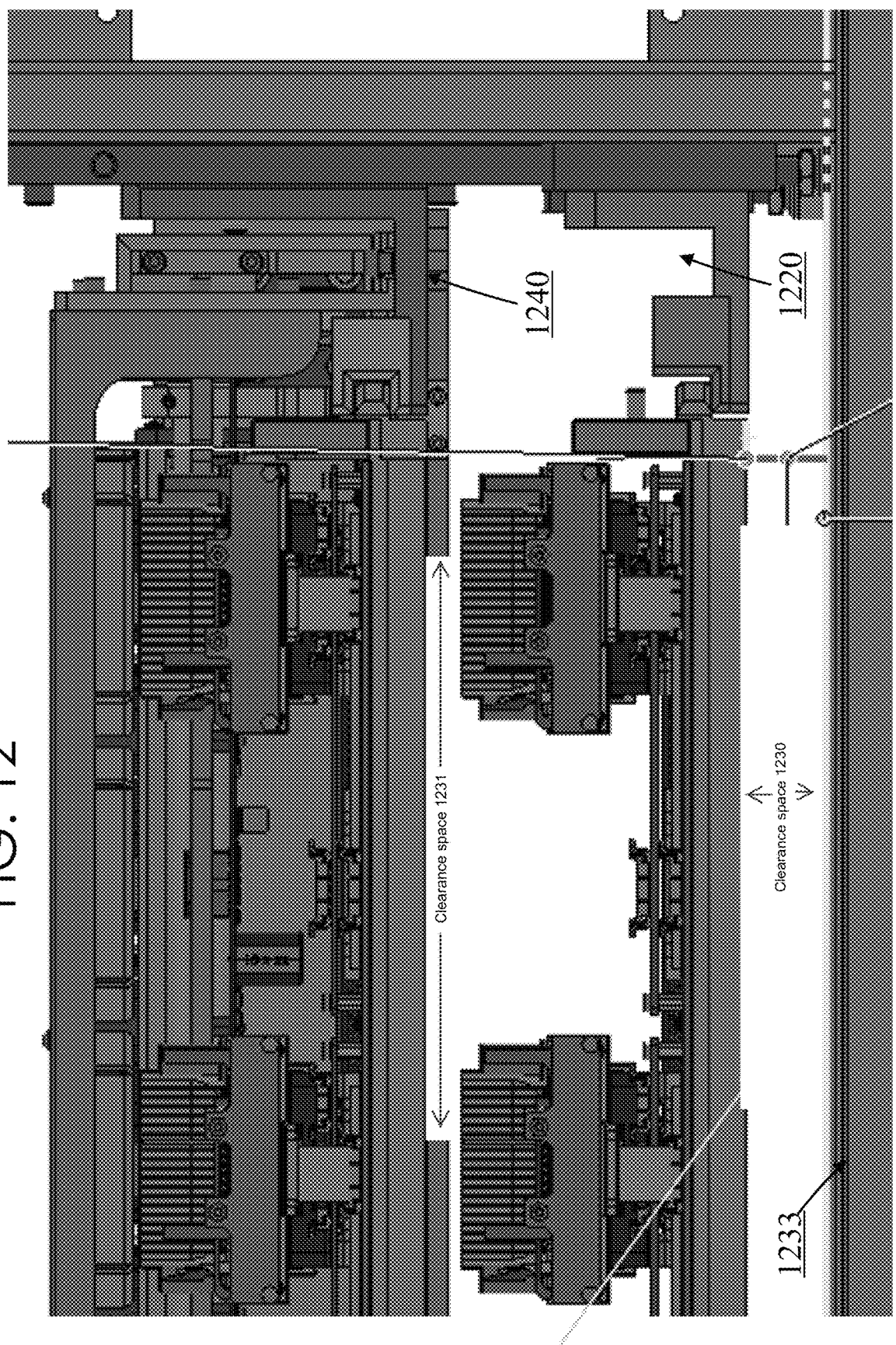
FIG. 12 illustrates the use of clearance spaces in a rack with a dedicated slot for loading TIBs in accordance with an embodiment of the present invention.

FIG. 12 illustrates the use of clearance spaces in a rack with a dedicated slot for loading TIBs in accordance with an embodiment of the present invention. As shown in FIG. 12, a clearance space 1230 of a minimum threshold height needs to be left between the dedicated slot 1220 and the bottom of the rack 1233 to allow a TIB to easily slide into the dedicated slot. Furthermore, a clear space 1231 of a minimum threshold height needs to be left between the dedicated slot 1220 and the next available regular slot 1240 on the tester rack.

Figure 13:
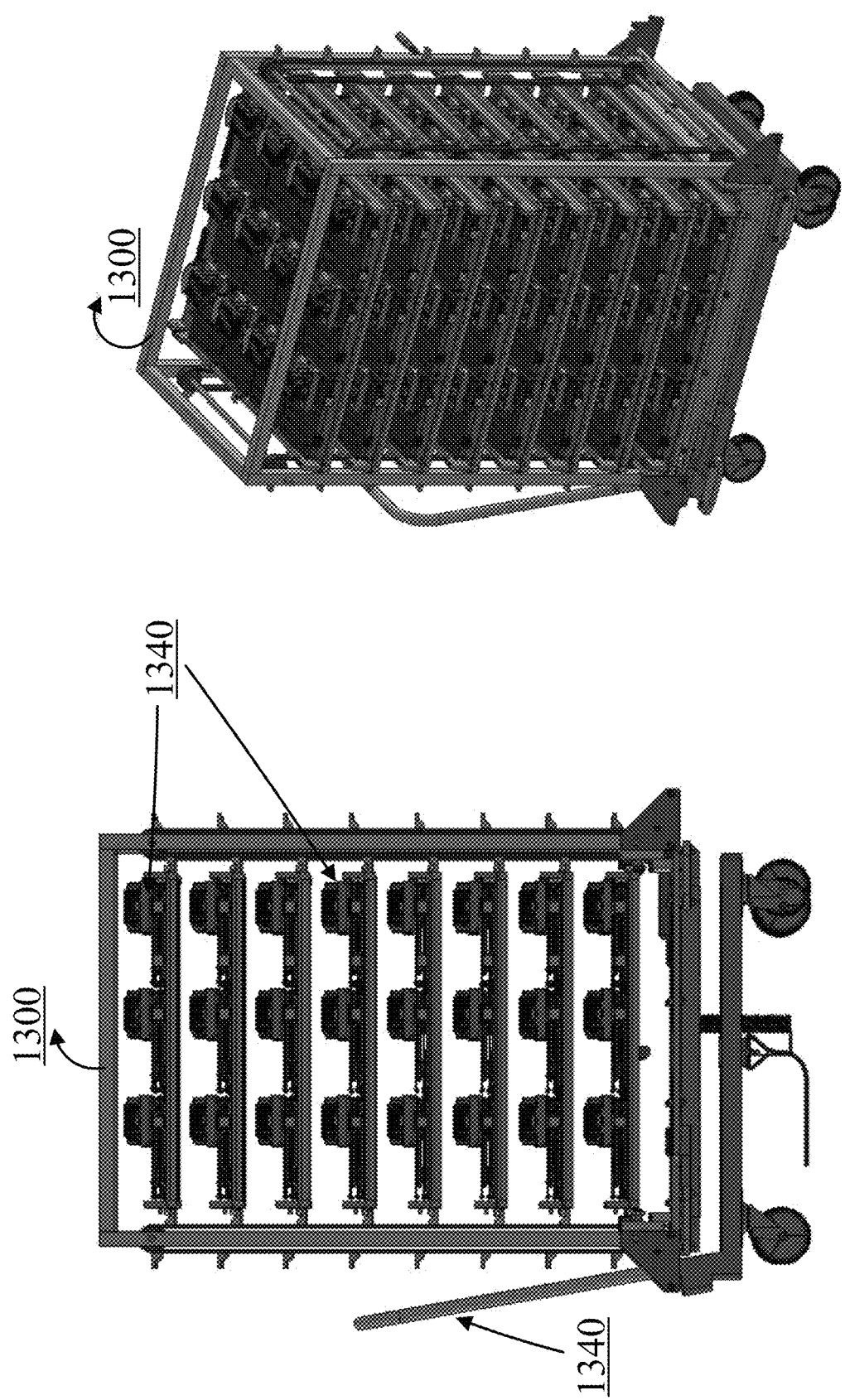
FIG. 13 illustrates a multi-TIB loading trolley that can be placed at the back of the tester system and used to load TIBs into a dedicated slot in the racks in accordance with an embodiment of the present invention.

FIG. 13 illustrates a multi-TIB loading trolley that can be placed at the back of the tester system and used to load TIBs into a dedicated slot in the racks in accordance with an embodiment of the present invention. Conventional tester systems only support a single TIB to be loaded from a jig onto an elevator. The trolley 1300 comprises multiple TIBs 1340. Furthermore, it comprises a handle 1340 that can be used to push the TIBs into the dedicated slot at the bottom of a rack.

Figure 14:
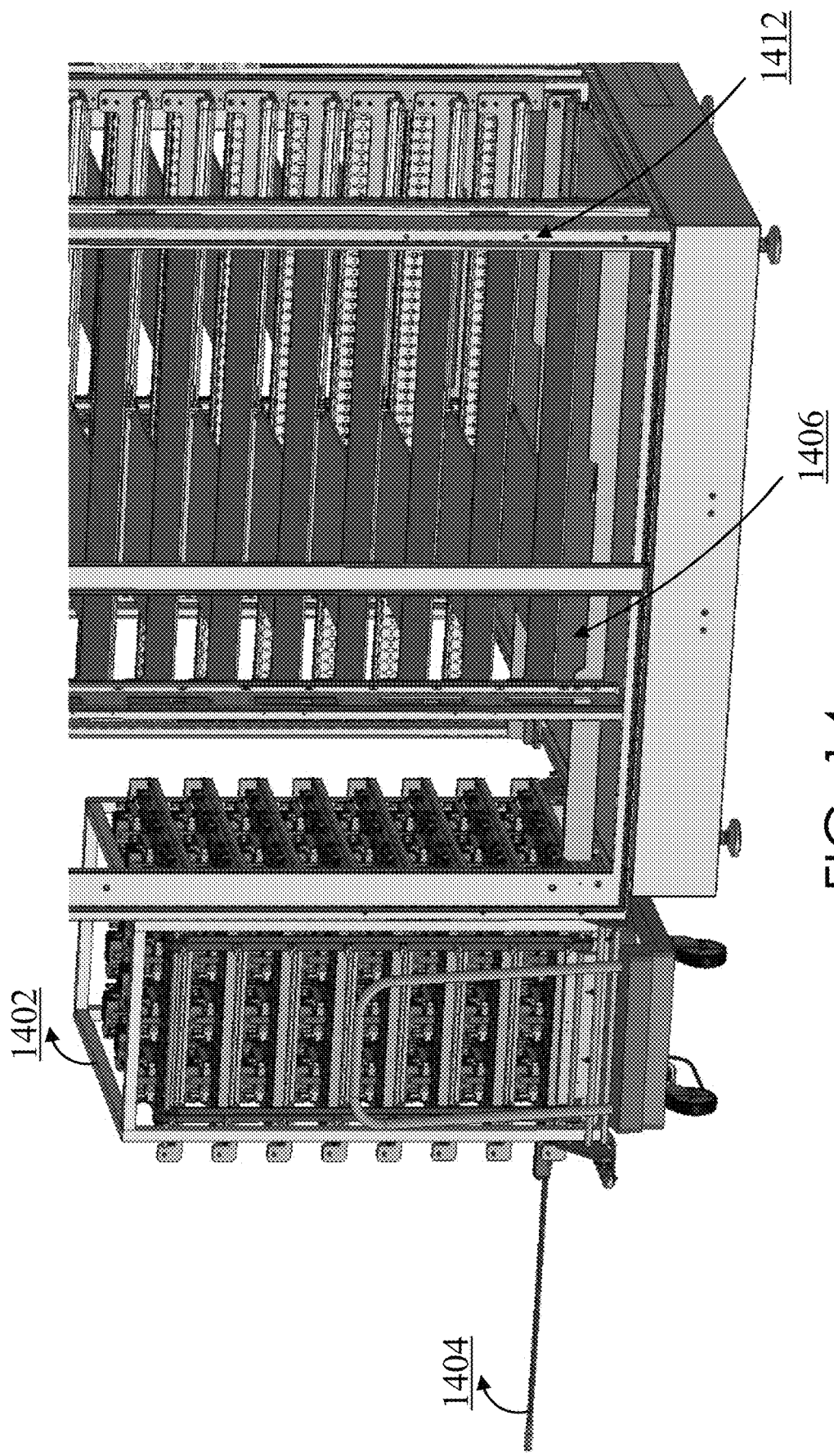
FIG. 14 illustrates the manner in which a multi-TIB loading trolley can be used to load TIBs into a dedicated slot in the racks in accordance with an embodiment of the present invention.

FIG. 14 illustrates the manner in which a multi-TIB loading trolley can be used to load TIBs into a dedicated slot in the racks in accordance with an embodiment of the present invention. As shown in FIG. 14, the multi-TIB trolley 1402 can be placed adjacent to the back of the tester (e.g., a side of the tester opposite from the elevator and the handler). A handle 1404 on the trolley 1402 can be used to push TIBs in from the trolley into a dedicated slot 1406 in the rack 1412. Note that the dedicated slot 1406 does not comprise electronics such as a PDB to enable a TIB to slide easily into the slot.

The trolley 1402 may, in one embodiment, comprise a crank (not shown) that allows the TIBs in the trolley to be moved downwards. For example, once a TIB has been pushed into the dedicated slot 1406 from the trolley, the crank on the trolley 1402 can be engaged to move the remaining TIBs downward so another TIB may then be pushed into the dedicated slot 1406 after the previous TIB has been moved away from the slot 1406. As noted above, an elevator on the front-side of the rack (e.g., the side opposite from the trolley) can move a TIB from the slot 1406 to a different available slot in the system for testing purposes.

Note that a similar mechanism can be employed when unloading the tester rack as well. Once a TIB is done being tested, the elevator can move the TIB to the dedicated slot 1406 from where it can be pushed back into the trolley 1402. Once a TIB is back in the trolley, the crank on the trolley can be engaged to move the TIB upwards.

Figure 15:
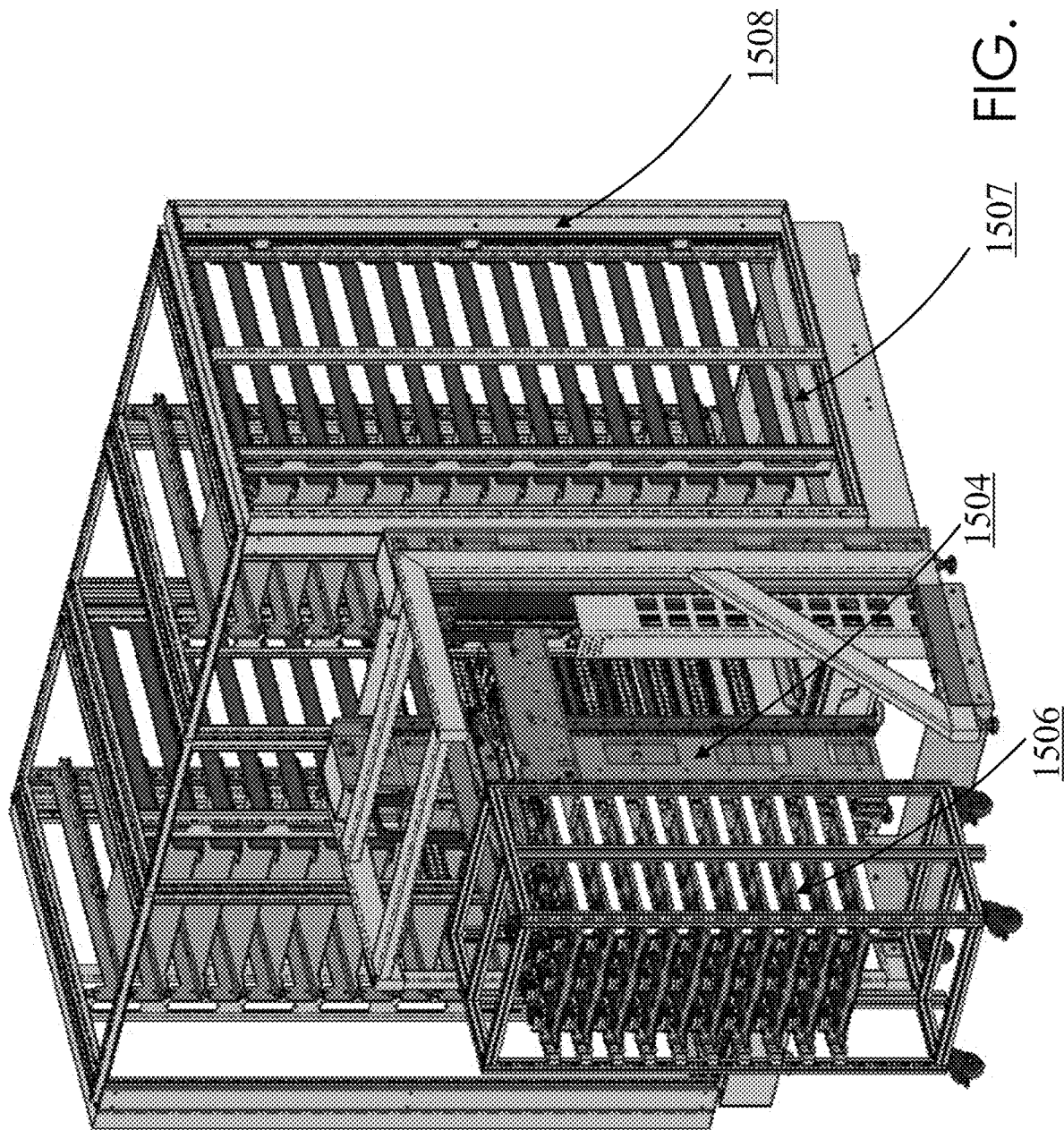
FIG. 15 illustrates the manner in which a trolley and an elevator can be used in conjunction to automate the loading of TIBs into a tester rack in accordance with embodiments of the present invention.

FIG. 15 illustrates the manner in which a trolley and an elevator can be used in conjunction to automate the loading of TIBs into a tester rack in accordance with embodiments of the present invention. In one embodiment, both a front-side elevator (not shown) and a back-side elevator 1504 may be employed to automate the loading of TIBs into a tester rack 1508 from a trolley 1506.

In the embodiment shown in FIG. 14, manual intervention is required to push the TIBs into a tester rack one by one from a trolley. The embodiment of FIG. 15, however, is fully automated using the elevator 1504 which allows the TIBs to be transferred from the trolley 1506 without manual intervention. Both the elevator 1504 and trolley 1506 dock into the back-side of the tester rack 1508 (e.g., a side opposite from the front-side elevator and the handler). The elevator 1504 may be designed so that it can move in the x-y direction (in addition to the z-direction) to reach into the appropriate slot in the trolley and transfer a TIB into the dedicated slot 1507 within the tester rack 1508. Once a TIB has been positioned into the dedicated slot 1507 using the elevator 1504, a front-side elevator (not shown) can then move the TIB to an open slot within the tester rack 1508 by moving it in the z-direction.

In one embodiment, the trolley 1506 and the elevator 1504 may be attached to each other and be part of a single system that can be used in conjunction with any tester rack in the production environment to load and unload TIBs from a respective rack. Instead of having a dedicated loading and unloading mechanism per tester rack as in conventional tester systems, embodiments of the present invention advantageously allow the trolley and elevator combination to be used in combination with any tester rack in a testing environment.

Figure 16:
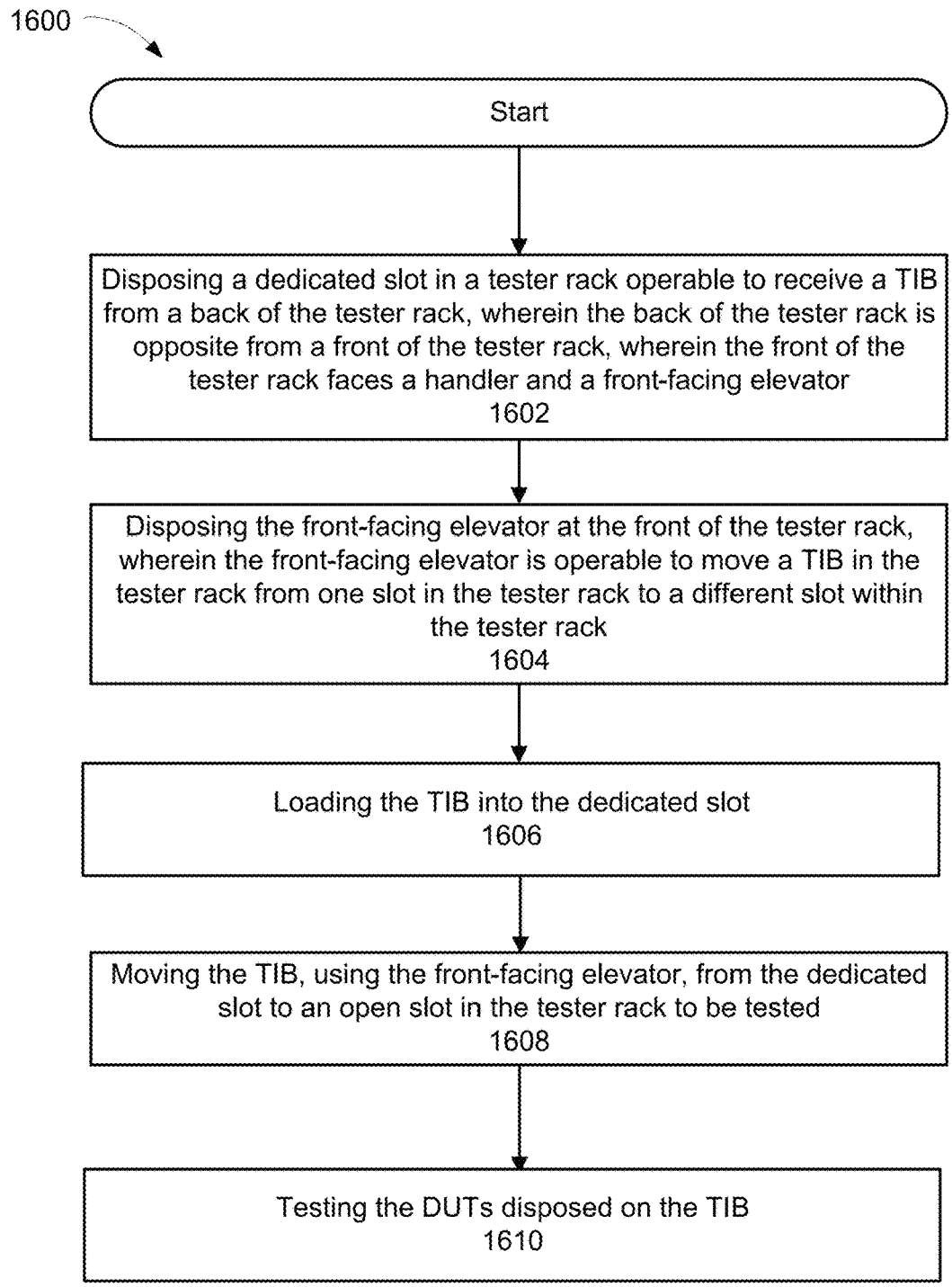
FIG. 16 depicts a flowchart illustrating an exemplary process 1600 for loading TIBs into a tester rack and testing the DUTs disposed on the TIBs in accordance with an embodiment of the present invention.

FIG. 16 depicts a flowchart illustrating an exemplary computer controlled process 1600 for loading TIBs into a tester rack and testing the DUTs disposed on the TIBs in accordance with an embodiment of the present invention. While the various steps in this flowchart are presented and described sequentially, one of ordinary skill will appreciate that some or all of the steps can be executed in different orders and some or all of the steps can be executed in parallel. Further, in one or more embodiments of the invention, one or more of the steps described below can be omitted, repeated, and/or performed in a different order. Accordingly, the specific arrangement of steps shown in FIG. 16 should not be construed as limiting the scope of the invention. Rather, it will be apparent to persons skilled in the relevant art(s) from the teachings provided herein that other functional flows are within the scope and spirit of the present invention. Flowchart 1600 may be described with continued reference to exemplary embodiments described above, though the method is not limited to those embodiments.

At step 1602, a dedicated slot is disposed in a tester rack operable to receive a TIB from a back of the tester rack, wherein the back of the tester rack is opposite a front of the tester rack, wherein the front of the tester rack faces a handler and a front-facing elevator.

At step 1604, the front-facing elevator is disposed at a front of the tester rack, wherein the front-facing elevator is operable to move a TIB in the tester rack from one slot to a different slot within the tester rack.

At step 1606, the TIB is loaded into the tester rack.

At step 1608, using the front-facing elevator, the TIB in the dedicated slot is moved to an open/available slot in the tester rack. In one embodiment, the open slot comprises a power distribution board that can connect with the TIB to perform a test of the DUTs in the TIB.

At step 1610, the DUTs disposed on the TIB are tested once moved into the available slot.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as may be suited to the particular use contemplated.

What is claimed is:

1. A testing apparatus comprising:
   a rack comprising a plurality of slots wherein at least one slot in the rack is dedicated to receive a test interface board (TIB) from a back of the rack, wherein the back of the rack is opposite to a front of the rack, wherein the front of the rack faces both a handler and a front-facing elevator;
   a handler operable to load devices under test (DUTs) onto the TIB; and
   the front-facing elevator operable to move the TIB from the at least one slot to an available slot in the rack, wherein the available slot comprises power electronics operable to connect to the TIB to test devices under test (DUT) disposed on the TIB.

2. The testing apparatus of claim 1, further comprising:
   a trolley operable to carry multiple TIBs which are positioned adjacent to the back of the rack, wherein the TIB is loaded into the at least one slot by pushing it manually from a slot in the trolley into the at least one slot in the rack.

3. The testing apparatus of claim 1, further comprising:
   a trolley operable to carry multiple TIBs which are positioned at the back of the rack; and
   a back-facing elevator positioned adjacent to the back of the rack and positioned in between the trolley and the rack, wherein the back-facing elevator is operable to automatically move the TIB out of a slot in the trolley and into the at least one slot.

4. The testing apparatus of claim 1 wherein the at least one slot does not comprise power electronics.

5. The testing apparatus of claim 1, wherein the front-facing elevator comprises a sensor operable to determine which of the plurality of slots is available.

6. The testing apparatus of claim 1, wherein the at least one slot comprises side-rails and guard-rails operable to guide the TIB to an appropriate position within the at least one slot.

7. The testing apparatus of claim 1, wherein the at least one slot comprises a sensor operable to communicate to the front-facing elevator when the TIB is loaded into the at least one slot.

8. The testing apparatus of claim 1, wherein each TIB comprises a plurality of socket interface boards, wherein each socket interface board comprises:
   a socket to hold a DUT;
   a discrete active thermal interposer comprising thermal properties and operable to make thermal contact with the DUT;
   a superstructure operable to contain the discrete active thermal interposer; and
   an actuation mechanism operable to provide a contact force to bring the discrete active thermal interposer in contact with the DUT.

9. The testing apparatus of claim 8, wherein the actuation mechanism is part of a parallel actuation mechanism operable to actuate sockets on the plurality of socket interface boards substantially simultaneously.

10. A testing system comprising:
    a tester rack comprising a plurality of slots wherein at least one slot in the tester rack is a dedicated slot operable to receive a carrier from a rear position of the tester rack, wherein the rear position of the tester rack is opposite a forward position of a tester rack, wherein the forward position of the tester rack faces a handler and a front-facing elevator, wherein the carrier comprises an array of DUTs, wherein each DUT in the array of DUTs aligns with a respective socket of a plurality of sockets disposed on a test interface board (TIB) operable to be affixed in an available slot of the plurality of slots, and wherein the dedicated slot is different from an available slot;

a handler operable to load devices under test (DUTs) onto the carrier; and the front-facing elevator operable to move the carrier from the dedicated slot to the available slot in the tester rack.

11. The testing system of claim 10, wherein the available slot further comprises: a power distribution board (PDB); and a plurality of socket covers, wherein each socket cover of the plurality of socket covers is operable to actuate a top portion of each DUT of the array of DUTs in the carrier.

12. The testing system of claim 10, wherein the available slot further comprises a plurality of socket covers, each operable to actuate a top portion of each DUT of the array of DUTs in the carrier, and wherein the plurality of socket covers are associated with a parallel cover assembly system configured to align and place each of the plurality of socket covers over a respective DUT from the array of DUTs.

13. The testing system of claim 10, further comprising:
a trolley operable to carry multiple TIBs positioned adjacent to the rear position of the tester rack; and
a back-facing elevator positioned adjacent to the rear position of the tester rack and positioned in between the trolley and the tester rack, wherein the back-facing elevator is operable to automatically move the carrier out of a slot in the trolley and into the dedicated slot.

14. The testing system of claim 10, wherein the front-facing elevator communicates with a database comprised within a computer communicatively coupled to the testing system to determine which slots of the plurality of slots are available.

15. A method of testing DUTs on a Burn-in-Board (BIB), the method comprising:
disposing a dedicated slot in a tester rack operable to receive the BIB from a back of the tester rack, wherein the BIB comprises a plurality of DUTs disposed on the BIB, and wherein the back of the tester rack is opposite from a side of the tester rack facing a handler and a front-facing elevator;
displacing the front-facing elevator adjacent to a front of the tester rack, wherein the front-facing elevator is operable to move the BIB in the tester rack from the dedicated slot to an available slot in the tester rack, wherein the available slot comprises power electronics to connect to the BIB;
loading the BIB into the dedicated slot in the tester rack;
moving the BIB, using the front-facing elevator, from the dedicated slot to the available slot; and
testing the plurality of DUTs while the BIB is positioned in the available slot.

16. The method of claim 15 further comprising:
positioning a trolley operable to carry multiple BIBs at the back of the tester rack; and
disposing a back-facing elevator adjacent to the back of the tester rack and positioned in between the trolley and the tester rack, wherein the back-facing elevator is operable to automatically move the BIB out of a slot in the trolley and into the dedicated slot.

17. The method of claim 16, wherein the back-facing elevator is operable to move in a three-dimensional direction.

18. The method of claim 15 further comprising disposing a trolley operable to carry multiple BIBs adjacent to the back of the tester rack, and wherein the loading the BIB comprises pushing it manually from a slot in the trolley into the dedicated slot in the tester rack.

19. The method of claim 18, wherein the pushing comprises using a handle disposed on the trolley to push the BIB into the dedicated slot.

20. The method of claim 15, wherein the front-facing elevator comprises a sensor operable to determine which of the plurality of slots is available.

* * * * *